United States Patent
Dai

(10) Patent No.: US 11,127,935 B2
(45) Date of Patent: Sep. 21, 2021

(54) DISPLAY PANEL, PREPARATION METHOD THEREOF AND DISPLAY DEVICE

(71) Applicant: Shanghai AVIC OPTO Electronics Co., Ltd., Shanghai (CN)

(72) Inventor: Wenjun Dai, Shanghai (CN)

(73) Assignee: Shanghai AVIC OPTO Electronics Co., Ltd., Shanghai (CN)

(*) Notice: Subject to any disclaimer, the term of this patent is extended or adjusted under 35 U.S.C. 154(b) by 85 days.

(21) Appl. No.: 16/742,420

(22) Filed: Jan. 14, 2020

(65) Prior Publication Data

US 2021/0066672 A1 Mar. 4, 2021

(30) Foreign Application Priority Data

Aug. 30, 2019 (CN) .......................... 201910817767.6

(51) Int. Cl.
| | | |
|---|---|---|
| *H01L 51/56* | (2006.01) | |
| *H01L 27/32* | (2006.01) | |
| *H01L 51/52* | (2006.01) | |
| *G02F 1/1339* | (2006.01) | |
| *G02F 1/1362* | (2006.01) | |
| *H01L 27/12* | (2006.01) | |

(52) U.S. Cl.
CPC ............ *H01L 51/56* (2013.01); *G02F 1/1339* (2013.01); *G02F 1/136227* (2013.01); *H01L 27/3258* (2013.01); *H01L 51/5253* (2013.01); *H01L 27/124* (2013.01); *H01L 2251/105* (2013.01)

(58) Field of Classification Search
CPC ................ H01L 51/56; H01L 51/5253; H01L 27/3258; H01L 2251/105; H01L 23/3127; H01L 27/124
USPC ............................. 438/22, 24; 257/75, 79, 81
See application file for complete search history.

(56) References Cited

U.S. PATENT DOCUMENTS

2016/0043102 A1* 2/2016 Zhang et al. ......... H01L 27/124
257/72

FOREIGN PATENT DOCUMENTS

| CN | 104133331 A | 11/2014 |
| CN | 105914212 A | 8/2016 |

* cited by examiner

*Primary Examiner* — Thinh T Nguyen
(74) *Attorney, Agent, or Firm* — von Briesen & Roper, s.c.

(57) ABSTRACT

Disclosed are a display panel, a preparation method thereof and a display device. The display panel includes a display region and a non-display region. The preparation method includes: providing a base substrate; preparing a first metal layer on a side of the base substrate; preparing a first insulation layer on a side of the first metal layer; performing a patterning process on the first insulation layer by using a mask plate to form a plurality of first via holes; preparing a passivation layer on a side of the first insulation layer; performing the patterning process on the passivation layer by using the same mask plate to form a plurality of second via holes, where a vertical projection of each of the first via holes on a plane where the base substrate is located covers a vertical projection of one of the second via holes on the plane.

20 Claims, 29 Drawing Sheets

DISPLAY PANEL, PREPARATION METHOD THEREOF AND DISPLAY DEVICE

CROSS-REFERENCES TO RELATED APPLICATIONS

This application claims priority to Chinese patent application No. CN201910817767.6, entitled "Display Panel, Preparation Method Thereof And Display Device" and filed on Aug. 30, 2019, the disclosure of which is incorporated therein by reference in its entirety.

TECHNICAL FIELD

Embodiments of the present disclosure relate to the field of display technologies and, in particular, to a display panel, a preparation method thereof and a display device.

BACKGROUND

An existing display product is generally a liquid crystal display or an organic light-emitting display. The liquid crystal display and the organic light-emitting display both include a plurality of different films. In their preparation process, a plurality of different mask plates are needed for performing a patterning process on each film.

However, as functions of the display are diversified, the liquid crystal display or the organic light-emitting display has an increasingly greater number of films and thus needs increasingly more mask plates in the preparation process. Since the mask plates have a relatively high price, the costs for purchasing the mask plates are relatively high, and the costs of the display in the process development and mass production stages are increasingly higher, limiting the development, design and mass production of a display panel.

SUMMARY

In view of this, embodiments of the present disclosure provide a display panel, a preparation method thereof and a display device, so as to solve the technical problem of high preparation costs of an existing display.

In a first aspect, the embodiments of the present disclosure provide a preparation method of a display panel. The display panel includes a display region and a non-display region surrounding the display region. The preparation method includes steps described below.

A base substrate is provided.

A first metal layer is prepared on a side of the base substrate, where the first metal layer includes a gate layer located in the display region and a gate metal layer located in the non-display region.

A first insulation layer is prepared on a side of the first metal layer facing away from the base substrate.

A patterning process is performed on the first insulation layer by using a mask plate to from a plurality of first via holes in the first insulation layer.

A passivation layer is prepared on a side of the first insulation layer facing away from the base substrate.

A patterning process is performed on the passivation layer by using the mask plate to form a plurality of second via holes in the passivation layer, where a vertical projection of each of the first via holes on a plane where the base substrate is located covers a vertical projection of one of the second via holes on the plane where the base substrate is located.

In a second aspect, the embodiments of the present disclosure further provide a display panel prepared by the preparation method described in the first aspect. The display panel includes a display region and a non-display region, and further includes a base substrate, a first metal layer, a first insulation layer and a passivation layer.

The first metal layer is located on a side of the base substrate, where the first metal layer includes a gate layer located in the display region and a gate metal layer located in the non-display region.

The first insulation layer is located on a side of the first metal layer facing away from the base substrate, where a plurality of first via holes are formed in the first insulation layer.

The passivation layer is located on a side of the first insulation layer facing away from the base substrate, where a plurality of second via holes are formed on the passivation layer, and a vertical projection of each of the first via holes on a plane where the base substrate is located covers a vertical projection of one of the second via holes on the plane where the base substrate is located.

In a third aspect, the embodiments of the present disclosure further provide a display device including the display panel described in the second aspect.

The embodiments of the present disclosure provide the display panel, the preparation method thereof, and the display device, in which the patterning process is performed on the first insulation layer above the first metal layer and on the passivation layer above the first insulation layer by using the same mask plate, thereby reducing costs for purchasing one mask plate and reducing preparation costs of the entire display panel at process development and mass production stages. Furthermore, the first insulation layer prepared with the mask plate is formed with the plurality of first via holes, and the passivation layer prepared with the mask plate is formed with the plurality of second via holes, where a vertical projection of the first via hole on the base substrate covers a vertical projection of the second via hole on the base substrate, thereby achieving electrical connections of films in the display panel through the first via holes and the second via holes, and ensuring normal operation of the display panel.

BRIEF DESCRIPTION OF DRAWINGS

Other features, objects and advantages of the present disclosure will become more apparent from a detailed description of non-restrictive embodiments with reference to the drawings.

DETAILED DESCRIPTION

In order to make the objects, technical solutions and advantages of the present disclosure clearer, the technical solutions of the present disclosure will be described below in detail in conjunction with the drawings in embodiments of the present disclosure and the specific embodiments. Apparently, the described embodiments are part, not all, of embodiments of the present disclosure, and based on the embodiments of the present disclosure, other embodiments obtained by those skilled in the art on the premise that no creative work is done are within the scope of the present disclosure.

Figure 1:
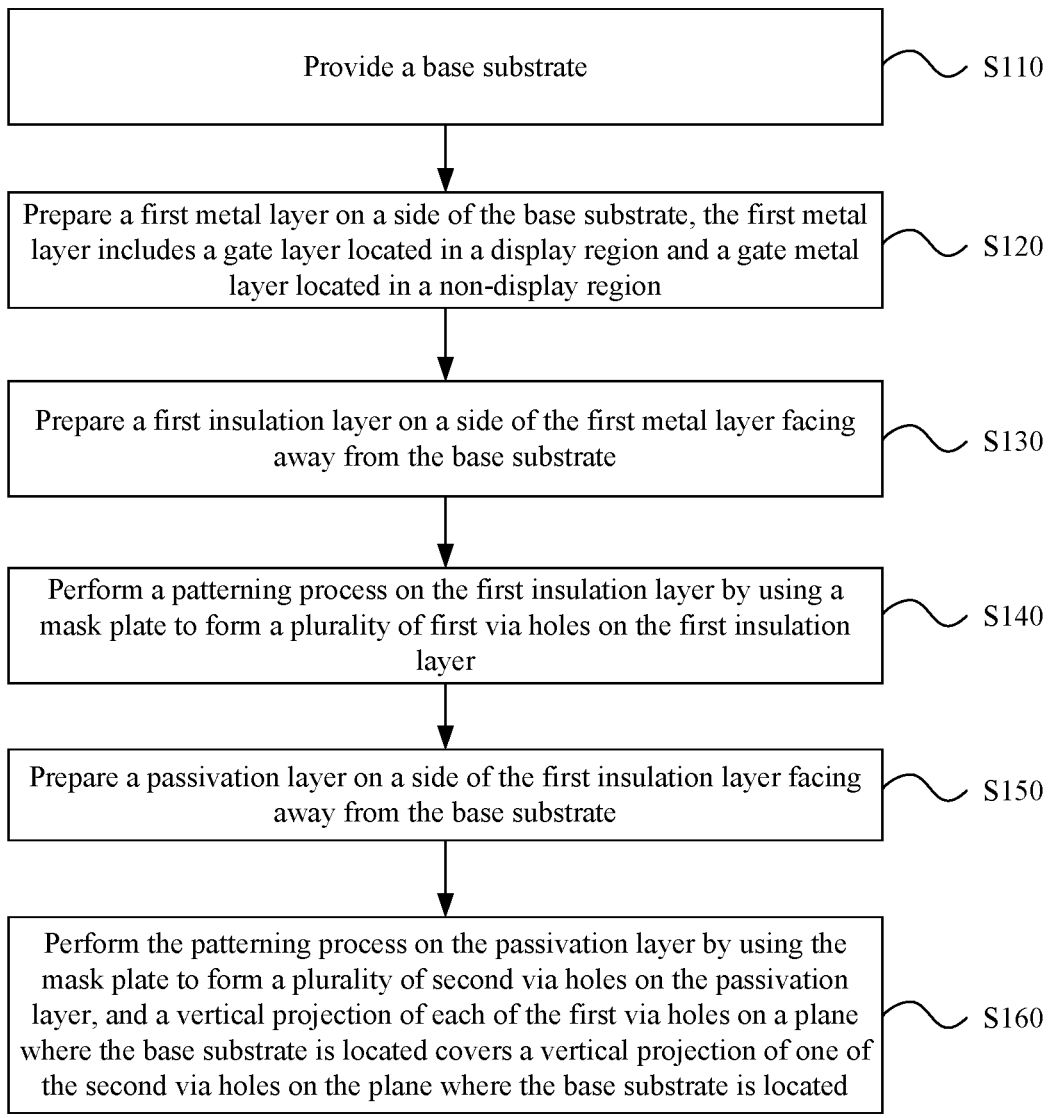
FIG. 1 is a flowchart of a preparation method of a display panel according to an embodiment of the present disclosure.
Figure 2:
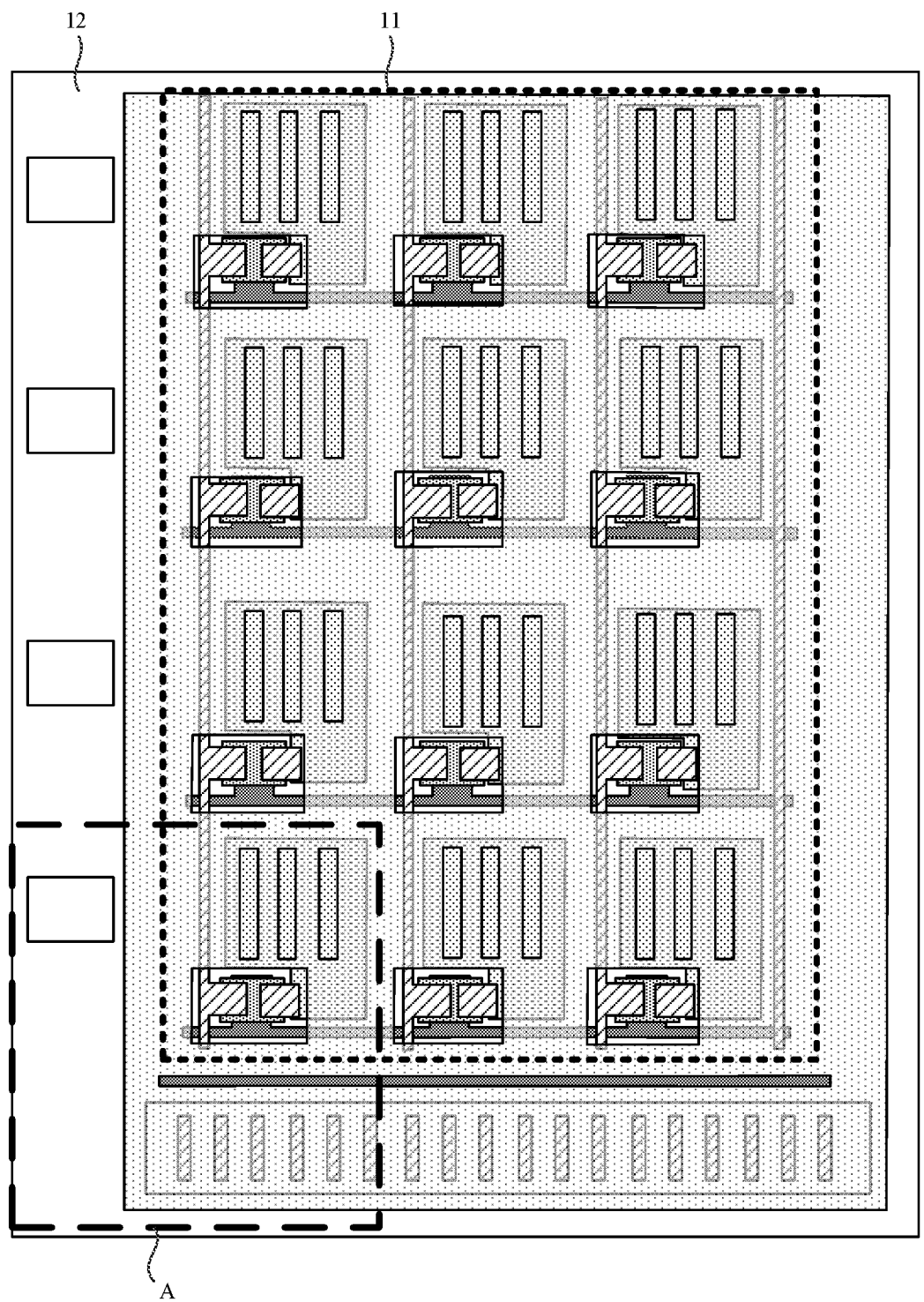
FIG. 2 is a structural view of a display panel according to an embodiment of the present disclosure.

FIG. 1 is a flowchart of a preparation method of a display panel according to an embodiment of the present disclosure. FIG. 2 is a structural view of a display panel according to an embodiment of the present disclosure. In conjunction with FIGS. 1 and 2, the preparation method of a display panel according to the embodiments of the present disclosure is used for preparing the display panel shown in FIG. 2. The display panel includes a display region 11 and a non-display region 12 surrounding the display region 11. The preparation method of a display panel according to the embodiments of the present disclosure includes steps described below.

In S110, a base substrate is provided.

Figure 3:
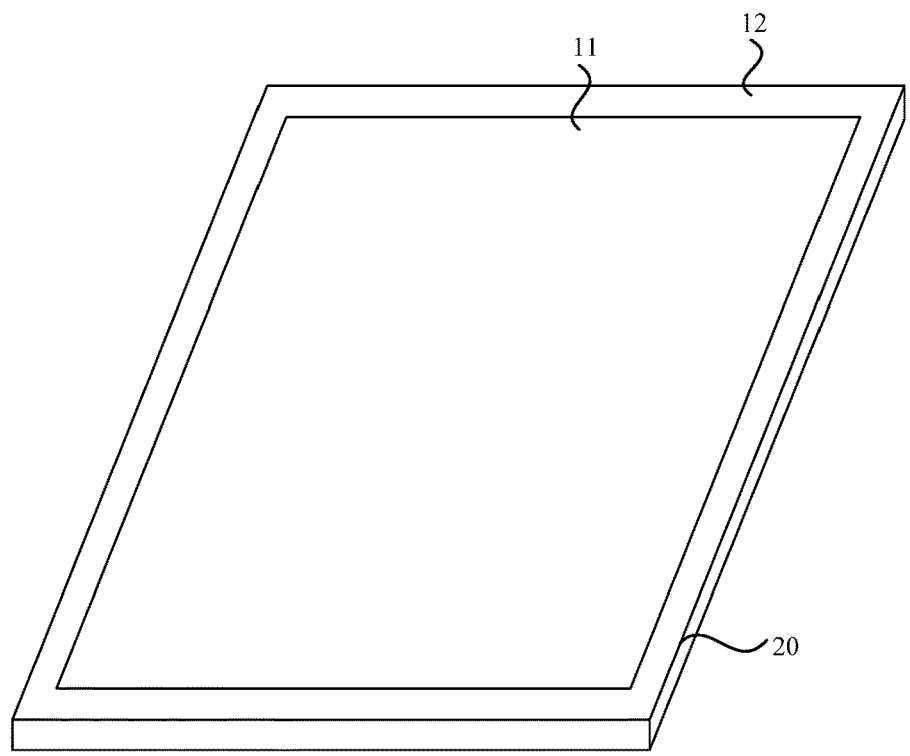
FIGS. 3 to 10 are structural views corresponding to steps of the preparation method of a display panel in FIG. 1.

FIG. 3 is a schematic view of a base substrate 20 according to an embodiment of the present disclosure. As shown in FIG. 3, the display region 11 and the non-display region 12 surrounding the display region 11 are formed on the base substrate 20. The base substrate 20 supports and protects other films in the display panel, and various films of the display panel are subsequently formed on the base substrate 20. Exemplarily, the base substrate 20 may be a rigid substrate or a flexible substrate. The rigid substrate may be a glass substrate and the flexible substrate may be a polyimide substrate. Alternatively, the base substrate 20 may also be another type of base substrate known to those skilled in the art, which is not limited in the embodiments of the present disclosure.

In S120, a first metal layer is prepared on a side of the base substrate. The first metal layer includes a gate layer located in the display region and a gate metal layer located in the non-display region.

Figure 4:
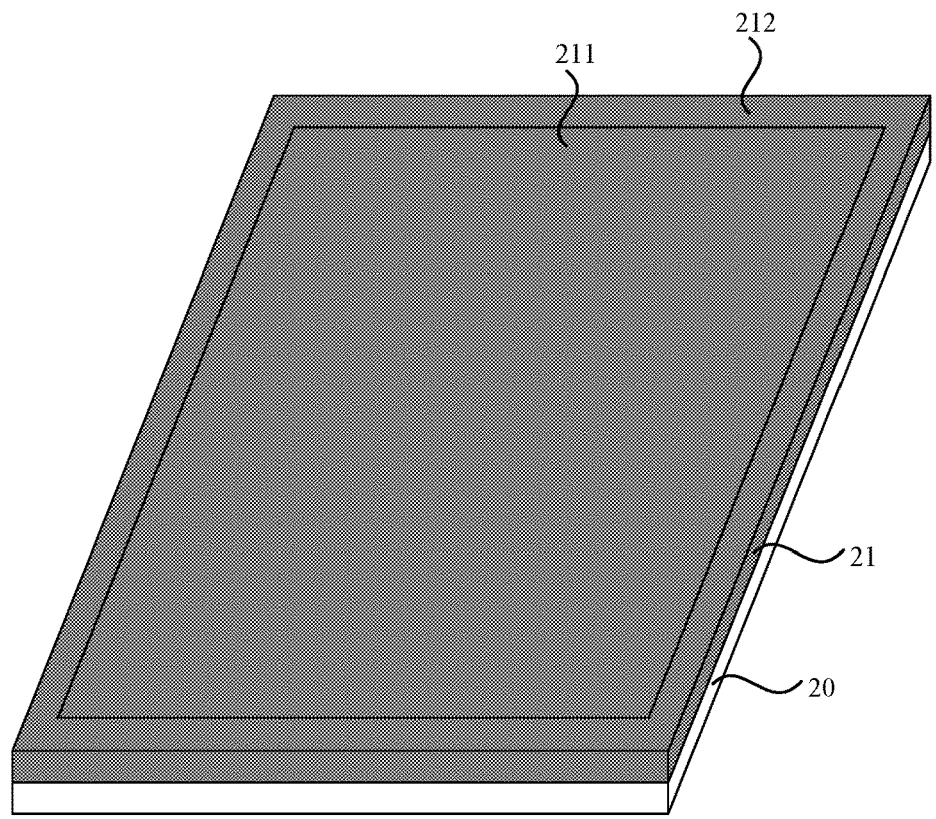

FIG. 4 is a structural view of a first metal layer prepared according to an embodiment of the present disclosure. As shown in FIG. 4, a first metal layer 21 may include a gate layer 211 located in the display region 11 and a gate metal layer 212 located in the non-display region 12. The gate layer 211 may include a gate of a thin film transistor and scan lines, and the gate metal layer 212 may be formed with other metal traces for conducting signals. The first metal layer may be formed with the gate and the scan lines or other metal patterns by a process such as etching.

In S130, a first insulation layer is prepared on a side of the first metal layer facing away from the base substrate.

Figure 5:
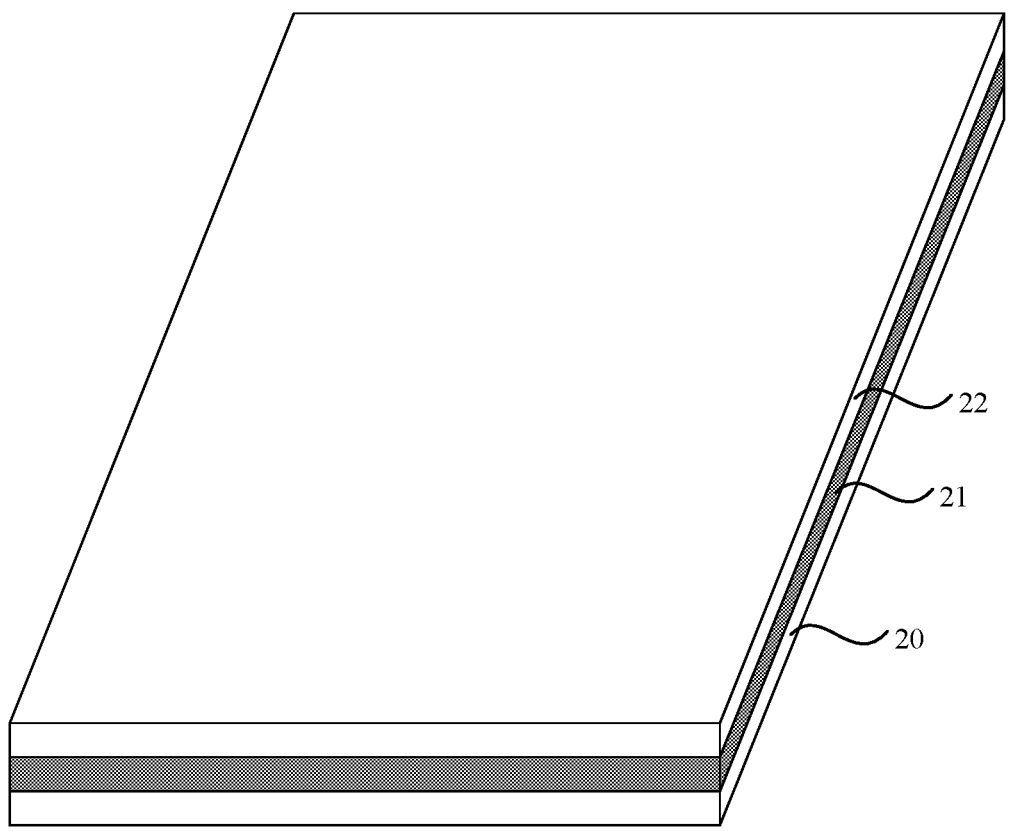

FIG. 5 is a structural view of a first insulation layer prepared according to an embodiment of the present disclosure. As shown in FIG. 5, a first insulation layer 22 covers the first metal layer 21. When the thin film transistor has a bottom-gate structure, the first insulation layer 22 may be a gate insulation layer between the gate layer 211 and an active layer (not shown). When the thin film transistor has a top-gate structure, the first insulation layer 22 may be an interlayer insulation layer between the gate layer 211 and an active metal layer (not shown). A type of the thin film transistor is not limited in the embodiments of the present disclosure, it is only necessary to ensure that the first insulation layer 22 is located on the side of the first metal layer 21 facing away from the base substrate 20.

In S140, a patterning process is performed on the first insulation layer by using a mask plate to form a plurality of first via holes in the first insulation layer.

Figure 6:
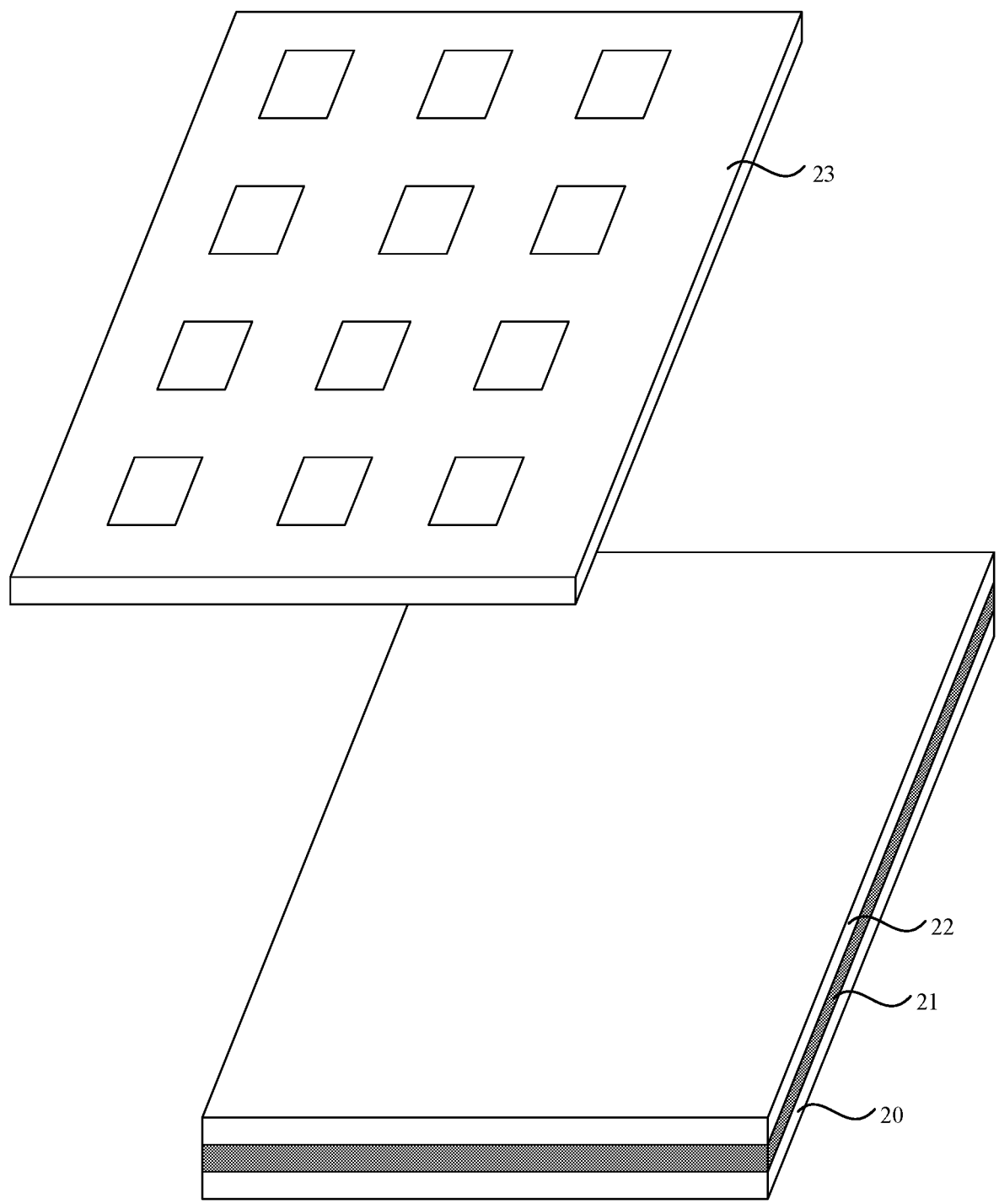
Figure 7:
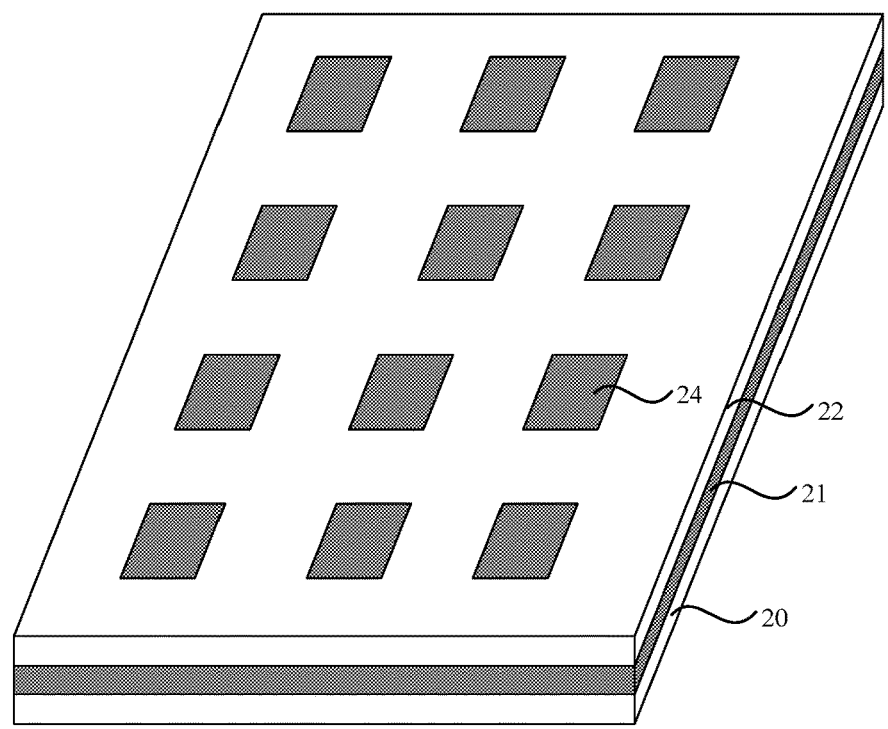

FIG. 6 illustrates a patterning process performed on a first insulation layer by using a mask plate according to an embodiment of the present disclosure. FIG. 7 is a structural view of a first insulation layer subjected to a patterning process. As shown in FIGS. 6 and 7, the patterning process is performed on the first insulation layer 22 by using a mask plate 23 to form a plurality of first via holes 24 in the first insulation layer 22, and the first metal layer 21 is exposed through the plurality of first via holes 24, thereby facilitating an electrical connection between the subsequent film and the first metal layer 21.

In S150, a passivation layer is prepared on a side of the first insulation layer facing away from the base substrate.

Figure 8:
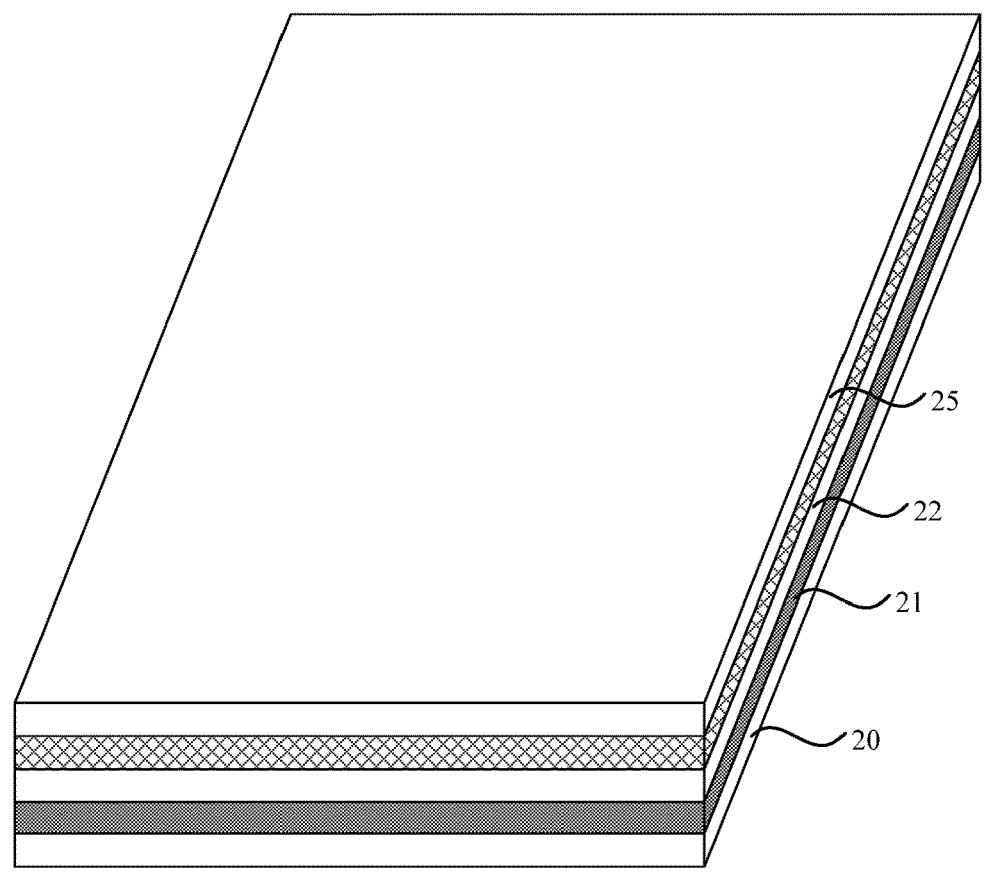

FIG. 8 is a structural view of a passivation layer prepared according to an embodiment of the present disclosure. As shown in FIG. 8, a passivation layer 25 covers the first insulation layer 22. The passivation layer 25 may be an insulating passivation layer between a pixel electrode and a common electrode in a liquid crystal display panel, or other passivation layers providing insulation protection for other films, such as a passivation layer in an organic light-emitting diode display panel. The embodiments of the present disclosure do not limit a type of a display panel where the passivation layer is disposed and a film where the passivation layer is located, and it is necessary to ensure that the passivation layer 25 is located on the side of the first insulation layer 22 facing away from the base substrate 20.

In S160, a patterning process is performed on the passivation layer by using the mask plate to form a plurality of second via holes in the passivation layer. A vertical projection of each of the first via holes on a plane where the base substrate is located covers a vertical projection of one of the second via holes on the plane where the base substrate is located.

Figure 9:
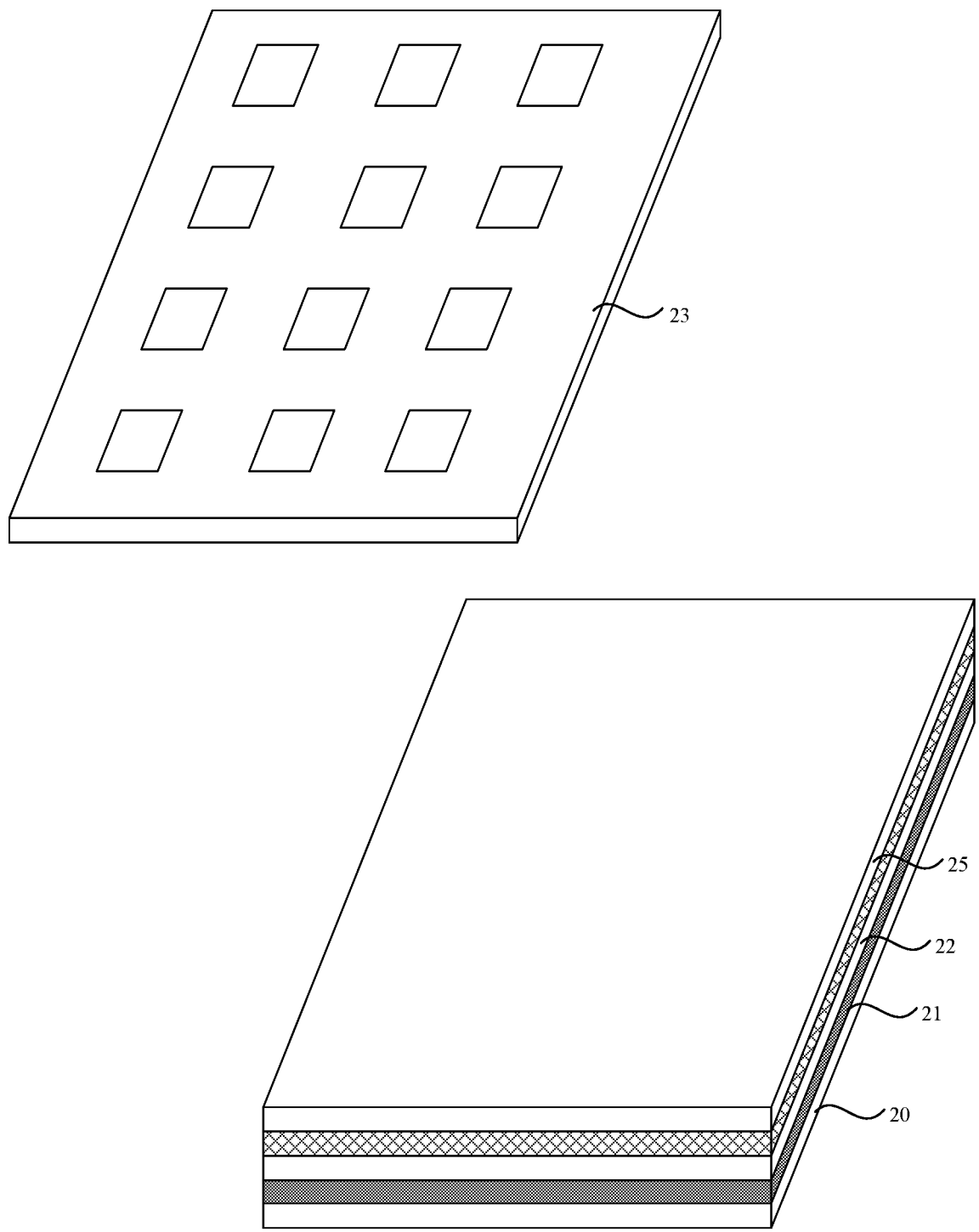
Figure 10:
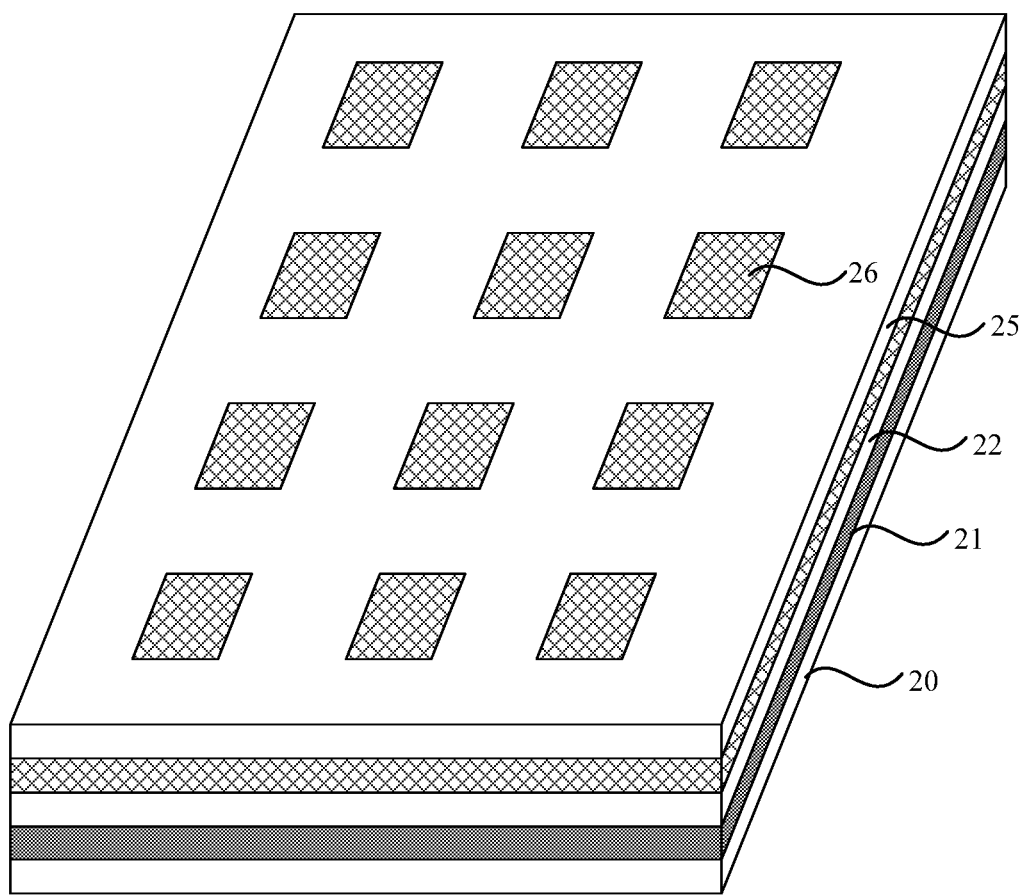

FIG. 9 illustrating a patterning process performed on a passivation layer by using a mask plate according to an embodiment of the present disclosure. FIG. 10 is a structural view of a passivation layer subjected to a patterning process. As shown in FIGS. 9 and 10, the patterning process is performed on the passivation layer 25 by using the mask plate 23 to form the plurality of second via holes 26 on the passivation layer 25, and films, located on a side of the passivation layer 25 facing towards the base substrate 20, are exposed by the plurality of second via holes 26, thereby facilitating an electrical connection between the subsequent film and the films located on the side of the passivation layer 25 facing towards the base substrate 20.

Furthermore, a vertical projection of each of the first via holes 24 on the base substrate 20 covers a vertical projection of one of the second via holes 26 on the base substrate 20, ensuring that the first via holes 24 and the second via holes 26 formed by using the same mask plate 23 on the first insulation layer 22 and the passivation layer 25 respectively are disposed correspondingly.

To sum up, in the preparation method of a display panel according to the embodiments of the present disclosure, the patterning process is performed on the first insulation layer above the first metal layer and on the passivation layer above the first insulation layer by using the same mask plate, thereby reducing costs for purchasing one mask plate and reducing preparation costs of the entire display panel at process development and mass production stages. Furthermore, the first insulation layer prepared with the mask plate is formed with the plurality of first via holes, and the passivation layer prepared with the mask plate is formed with the plurality of second via holes, where the vertical projection of the first via hole on the base substrate covers the vertical projection of the second via hole on the base substrate, thereby achieving electrical connections of films in the display panel through the first via holes and the second via holes, and ensuring normal operation of the display panel.

Figure 11:
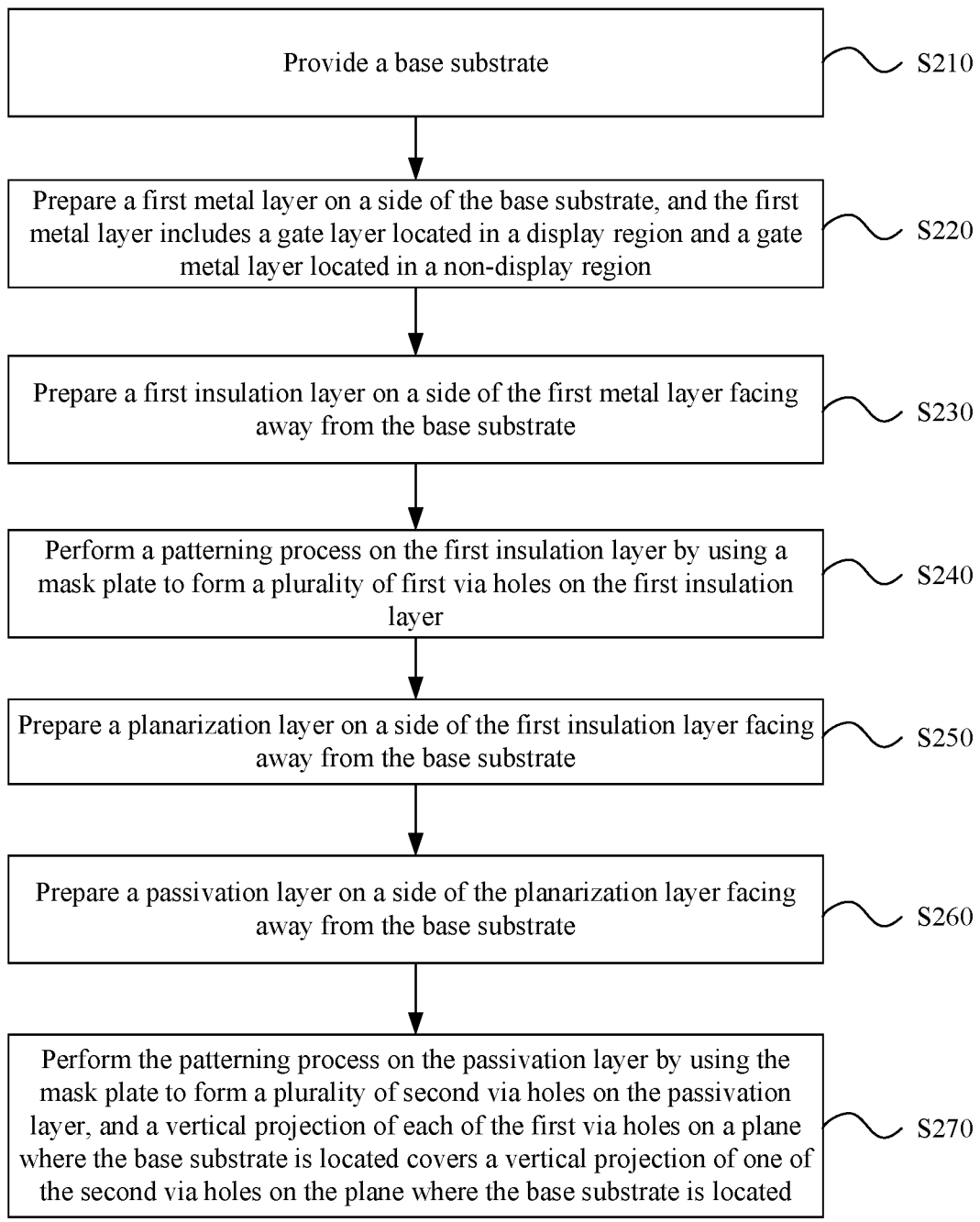
FIG. 11 is a flowchart of another preparation method of a display panel according to an embodiment of the present disclosure.

Optionally, the preparation method of a display panel according to the embodiments of the present disclosure may further include preparing a planarization layer between the first insulation layer and the passivation layer. Specifically, FIG. 11 is a flowchart of another preparation method of a display panel according to an embodiment of the present disclosure. As shown in FIG. 11, the preparation method of a display panel according to the embodiments of the present disclosure may include steps described below.

In S210, a base substrate is provided.

With continued reference to FIG. 3, the base substrate 20 supports and protects other films in the display panel.

In S220, a first metal layer is prepared on the side of the base substrate. The first metal layer includes a gate layer located in the display region and a gate metal layer located in the non-display region.

With continued reference to FIG. 4, the first metal layer 21 may include the gate layer 211 located in the display region 11 and the gate metal layer 212 located in the non-display region 12.

In S230, a first insulation layer is prepared on the side of the first metal layer facing away from the base substrate.

With continued reference to FIG. 5, the first insulation layer 22 covers the first metal layer 21.

In S240, a patterning process is performed on the first insulation layer by using a mask plate to form a plurality of first via holes in the first insulation layer.

With continued reference to FIGS. 6 and 7, the plurality of first via holes 24 are formed in the first insulation layer 22.

In S250, a planarization layer is prepared on the side of the first insulation layer facing away the base substrate.

In S260, a passivation layer is prepared on a side of the planarization layer facing away from the base substrate.

Figure 12:
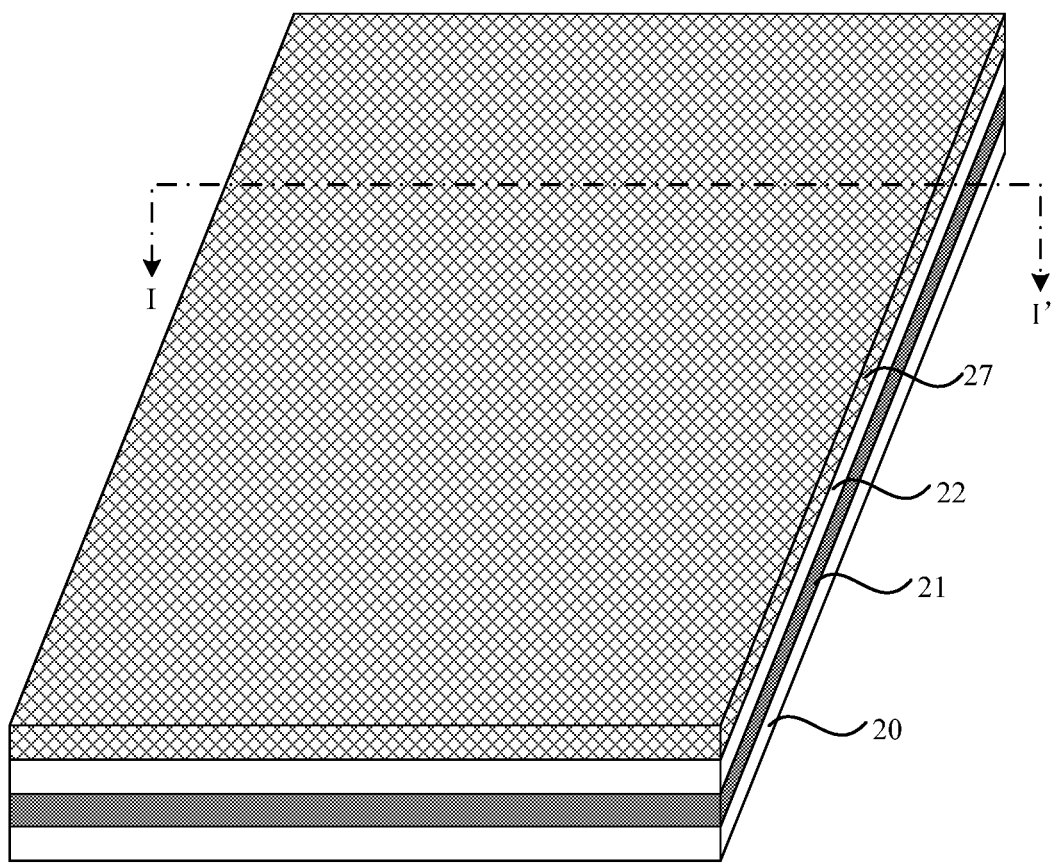
FIG. 12 is a structural view of a planarization layer prepared according to an embodiment of the present disclosure.

FIG. 12 is a structural view of a planarization layer prepared according to an embodiment of the present disclosure. In conjunction with FIGS. 8 and 12, a planarization layer 27 is located between the first insulation layer 22 and the passivation layer 25, and the planarization layer 27 covers the first insulation layer 22. The planarization layer 27 may provide etching protection for the first insulation layer 22 located below the planarization layer 27 and prevent an etching gas from damaging the first insulation layer 22 when the passivation layer 25 is etched with the etching gas. Meanwhile, the planarization layer 27 may also planarize the passivation layer 25 located above the planarization layer 27, thereby improving the planarity of the passivation layer 25.

Optionally, the planarization layer 27 may be an organic film, such as polyimides, an OC adhesive or other organic materials, or may also be other inorganic films that may be planarized, which is not limited in the present disclosure. However, it should be noted that when the planarization layer 27 is the inorganic film, it is necessary to ensure that the planarization layer 27 is insensitive to the etching gas, so that the planarization layer 27 is not damaged when gas etching is performed on the passivation layer 25, and the planarization layer 27 may provide the etching protection for the first insulation layer 22 located below the planarization layer 27.

In S270, an patterning process is performed on the passivation layer by using the mask plate to form a plurality of second via holes in the passivation layer. The vertical projection of the first via hole on the plane where the base substrate is located covers the vertical projection of the second via hole on the plane where the base substrate is located.

With continued reference to FIGS. 9 and 10, the patterning process is performed on the passivation lay 25 by using the mask plate 23 to form the plurality of second via holes 26 in the passivation layer 25.

To sum up, the preparation method of the display panel according to the embodiments of the present disclosure can not only reduce the costs for purchasing one mask plate and thus reduce the preparation costs of the entire display panel at the process development and mass production stages. Moreover, two layers share one mask plate, improving an alignment accuracy, especially for the preparation of via holes. Meanwhile, the planarization layer can be prepared to provide the etching protection for the first insulation layer below the planarization layer, ensuring that an etching process of the first insulation layer and an etching process of the passivation layer do not interfere with each other.

Optionally, FIG. 2 is a structural view of a display panel prepared by a preparation method thereof according to an embodiment of the present disclosure. As shown in FIG. 2, positions of the first via holes formed in the first insulation layer and positions of the second via holes formed in the passivation layer are different corresponding to different regions of the display panel. Different preparation methods for the display panel will be described in detail below with respect to different positions of the first via holes and the second via holes.

Firstly, a signal terminal providing region is used as an example for description.

Figure 13:
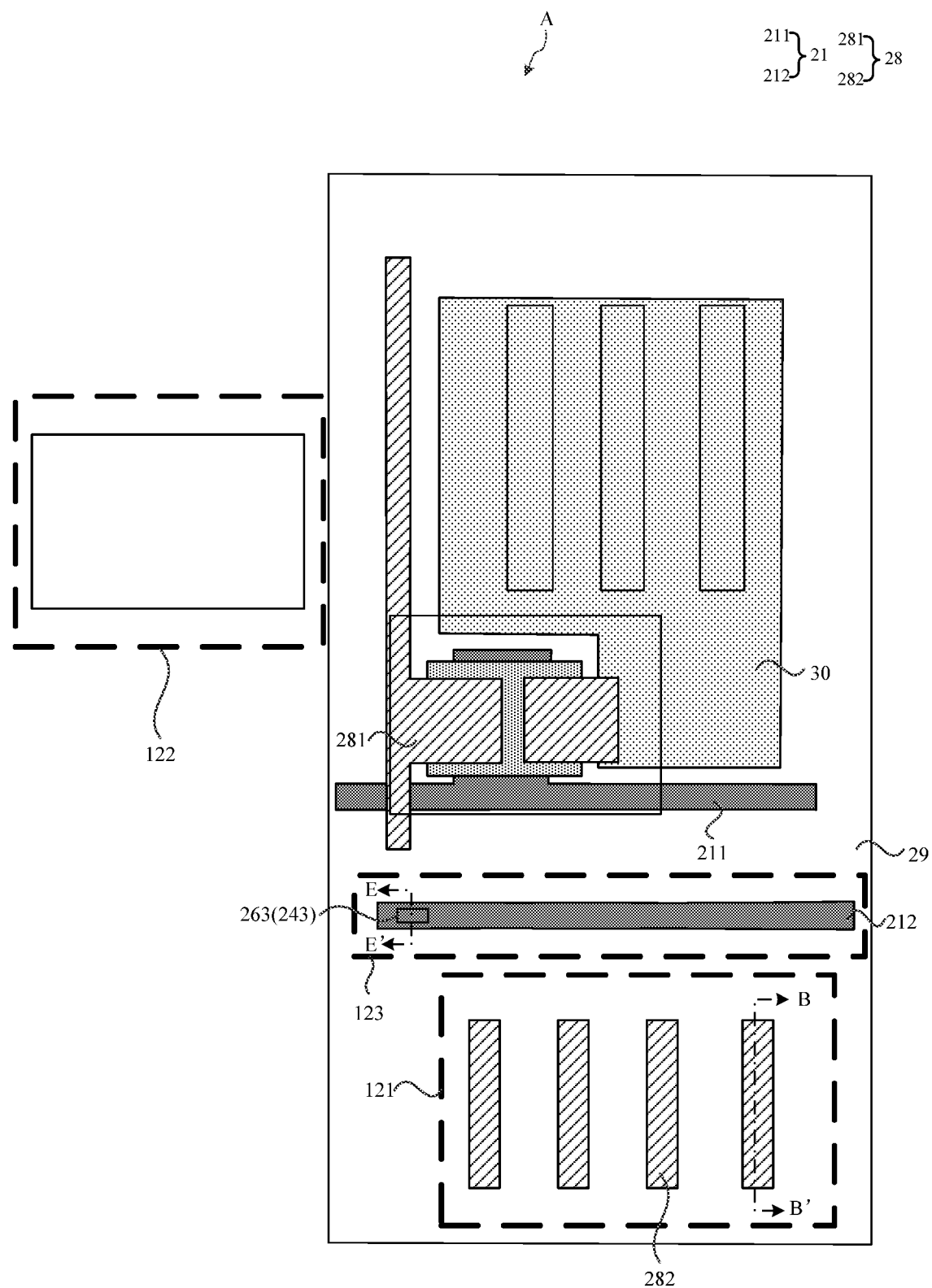
FIG. 13 is an enlarged structural view of a region A in FIG. 2.
Figure 14:
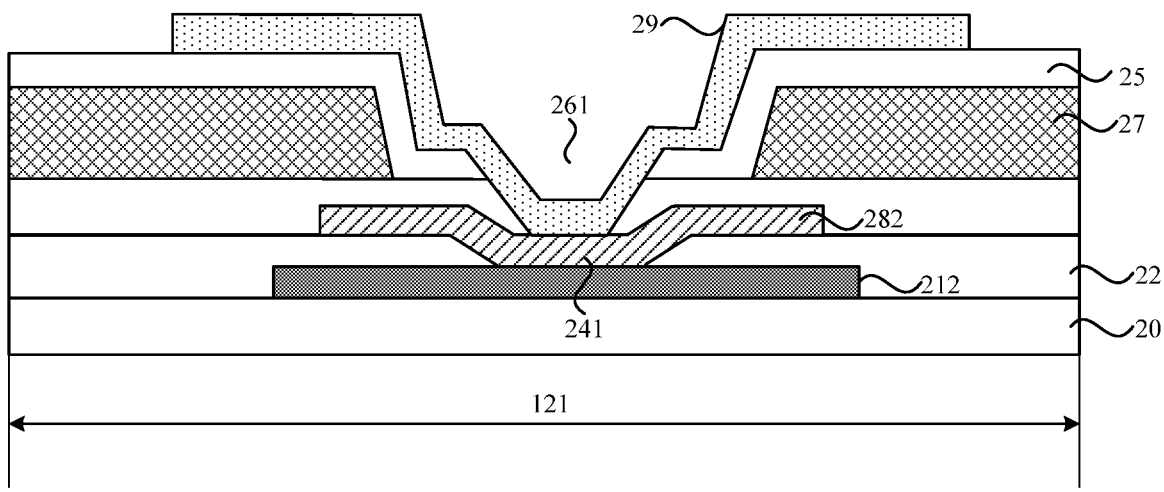
FIG. 14 is a sectional view of a display panel in FIG. 13 along a section line B-B'.
Figure 15:
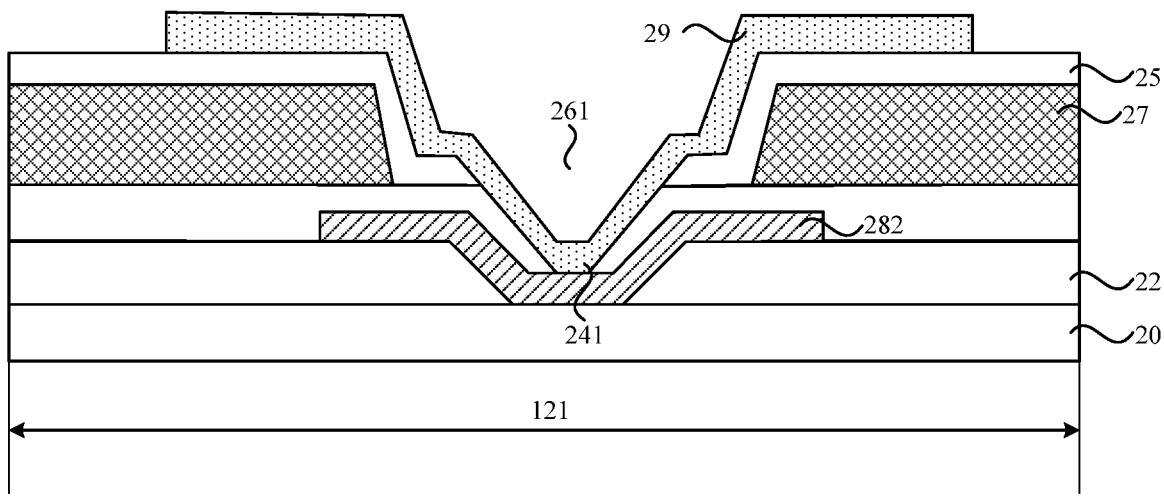
FIG. 15 is another sectional view of a display panel in FIG. 13 along a section line B-B'.
Figure 16:
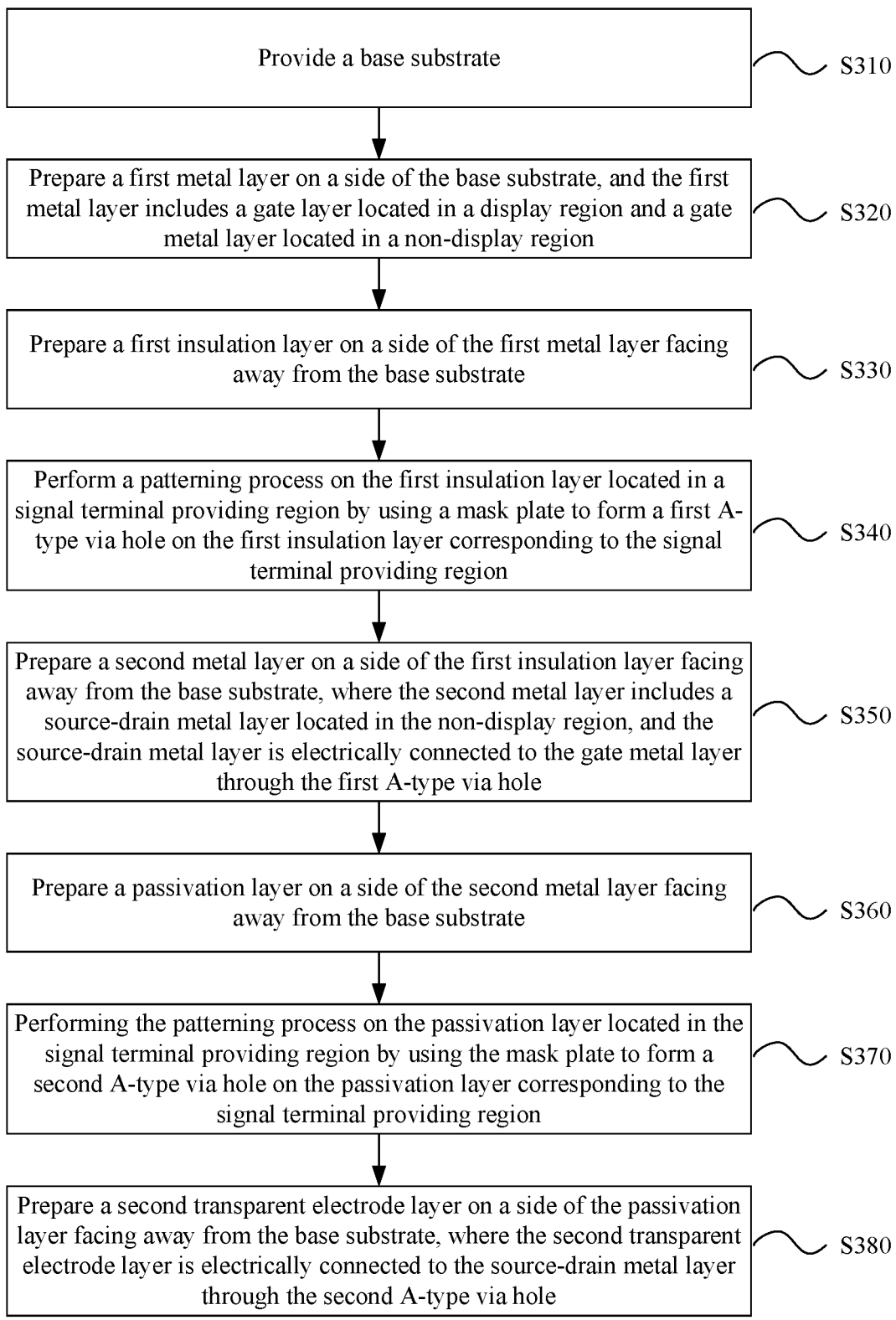
FIG. 16 is a flowchart of another preparation method of a display panel according to an embodiment of the present disclosure.

FIG. 13 is an enlarged structural view of a region A in FIG. 2, FIG. 14 is a sectional view of a display panel in FIG. 13 along a section line B-B', FIG. 15 is another sectional view of a display panel in FIG. 13 along a section line B-B', and FIG. 16 is a flowchart of another preparation method of a display panel according to an embodiment of the present disclosure. The preparation method of a display panel in FIG. 16 is a preparation method with respect to the signal terminal providing region in the display panel. As shown in FIG. 16, the preparation method of a display panel according to the embodiments of the present disclosure may include steps described below.

In S310, a base substrate is provided.

In S320, a first metal layer is prepared on the side of the base substrate. The first metal layer includes a gate layer located in the display region and a gate metal layer located in the non-display region.

In S330, a first insulation layer is prepared on the side of the first metal layer facing away from the base substrate.

In S340, a patterning process is performed on the first insulation layer located in the signal terminal providing region by using a mask plate to form a first A-type via hole in the first insulation layer corresponding to the signal terminal providing region.

Exemplarily, as shown in FIGS. 14 and 15, a signal terminal providing region 121 may be understood as a region where signal terminals are provided. The signal terminals may be signal terminals in a drive integrated circuit (IC) or signal terminals in a flexible circuit board, which is not limited in the embodiments of the present disclosure.

With continued reference to FIGS. 14 and 15, the patterning process is performed by using the mask plate on the first insulation layer 22 corresponding to the signal terminal providing region 121 to form a first A-type via hole 241 in the first insulation layer 22 corresponding to the signal terminal providing region 121.

In S350, a second metal layer is prepared on the side of the first insulation layer facing away from the base substrate. The second metal layer includes a source-drain metal layer located in the non-display region, and the source-drain metal layer is electrically connected to the gate metal layer through the first A-type via hole.

Exemplarily, a second metal layer 28 may include a source-drain layer (not shown) located in the display region 11 and a source-drain metal layer 282 located in the non-display region 12. The source-drain layer may include a source and a drain in the thin film transistor and data lines, and the source-drain metal layer 282 may be formed with other metal traces for conducting signals. The source-drain metal layer 282 corresponding to the signal terminal providing region 121 may be used for transmitting terminal signals.

As shown in FIG. 14, the source-drain metal layer 282 is electrically connected to the gate metal layer 212 through the first via hole 241.

In S360, a passivation layer is prepared on a side of the second metal layer facing away from the base substrate.

In S370, a patterning process is performed on the passivation layer located in the signal terminal providing region by using the mask plate to form a second A-type via hole in the passivation layer corresponding to the signal terminal providing region.

With continued reference to FIGS. 14 and 15, the patterning process is performed by using the mask plate on the passivation layer 25 corresponding to the signal terminal providing region 121 to form a second A-type via hole 261 in the passivation layer 25 corresponding to the signal terminal providing region 121. A vertical projection of the first A-type via hole 241 on the plane where the base substrate 20 is located covers a vertical projection of the second A-type via hole 261 on the plane where the base substrate 20 is located.

In S380, a second transparent electrode layer is prepared on a side of the passivation layer facing away from the base substrate. The second transparent electrode layer is electrically connected to the source-drain metal layer through the second A-type via hole.

With continued reference to FIGS. 13, 14 and 15, a second transparent electrode layer 29 is prepared on the side of the passivation layer 25 facing away from the base substrate 20, and the second transparent electrode layer 29 is electrically connected to the source-drain metal layer 282 through the second A-type via hole 261.

Exemplarily, the second transparent electrode layer 29 may be the pixel electrode or the common electrode in the liquid crystal display panel, which is not limited in the embodiments of the present disclosure. When the second transparent electrode layer 29 is the pixel electrode, a first transparent electrode 30 is disposed on a side of the passivation layer facing towards the base substrate 20, and the first transparent electrode 30 is served as the common electrode of the liquid crystal display panel. When the second transparent electrode layer 29 is the common electrode, the first transparent electrode 30 is disposed on the side of the passivation layer facing towards the base substrate 20, and the first transparent electrode 30 is served as the pixel electrode of the liquid crystal display panel. The pixel electrode and the common electrode together constitute a liquid crystal display panel in a transverse electric field mode.

Furthermore, since the signal terminal generally includes a metal layer, and a protective layer needs to be disposed on a side of the metal layer facing away from the base substrate to prevent the metal layer from being corroded by water and oxygen, the second transparent electrode layer 29 is also used as a protective layer in the embodiments of the present disclosure. In this way, the second transparent electrode layer 29 needs to be connected to the source-drain metal layer 282 through the second A-type via hole 261 in the passivation layer 25 to protect the source-drain metal layer 282 reused as the signal terminal from water and oxygen. Since the patterning process is performed on the first insulation layer 22 and the passivation layer 25 by using the same mask plate, corresponding to a process of the second A-type via hole 261, the first A-type via hole 241 is formed in the first insulation layer 22, and the source-drain metal layer 282 falls through the first A-type via hole 241 onto a film exposed through the first A-type via hole 241, where the film exposed through the first A-type via hole 241 may be, for example, the gate metal layer 212, as shown in FIG. 14, or the base substrate 20, as shown in FIG. 15.

It should be further noted that only the source-drain metal layer 282 reused as the signal terminal is used as an example is FIGS. 14 and 15 for description, and it is to be understood that the gate metal layer may also be reused as the signal terminal (not shown) or a separate metal film may be disposed as the signal terminal. When the gate metal layer is reused as the signal terminal, the second transparent electrode reused as the protective layer is connected to the gate metal layer through the second A-type via hole and the first A-type via holes. Whether the separate metal film or the existing metal film is reused as the signal terminal is not limited in the embodiments of the present disclosure, and only the source-drain metal layer 282 reused as the signal terminal is used as an example is FIGS. 14 and 15 for description.

Next, a first signal transmission region is used as an example for description.

Figure 17:
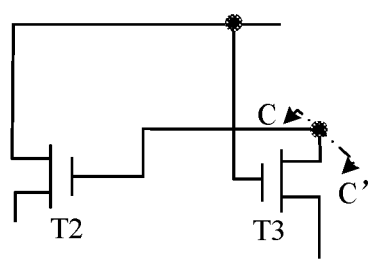
FIG. 17 is a schematic view of a partial circuit elements in a first signal transmission region in FIG. 13.
Figure 18:
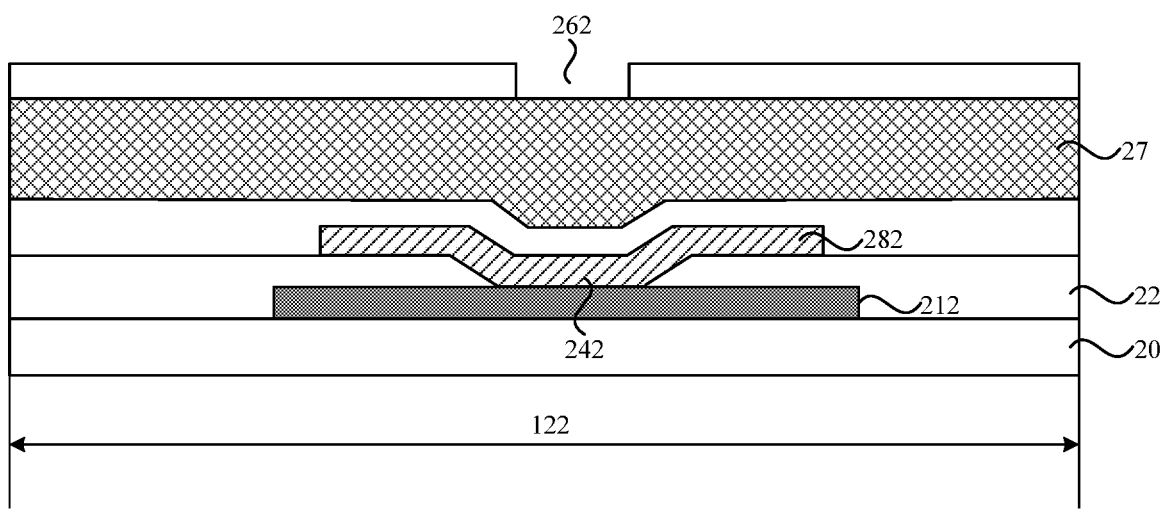
FIG. 18 is a sectional view of a circuit element in FIG. 17 along a section line C-C'.
Figure 19:
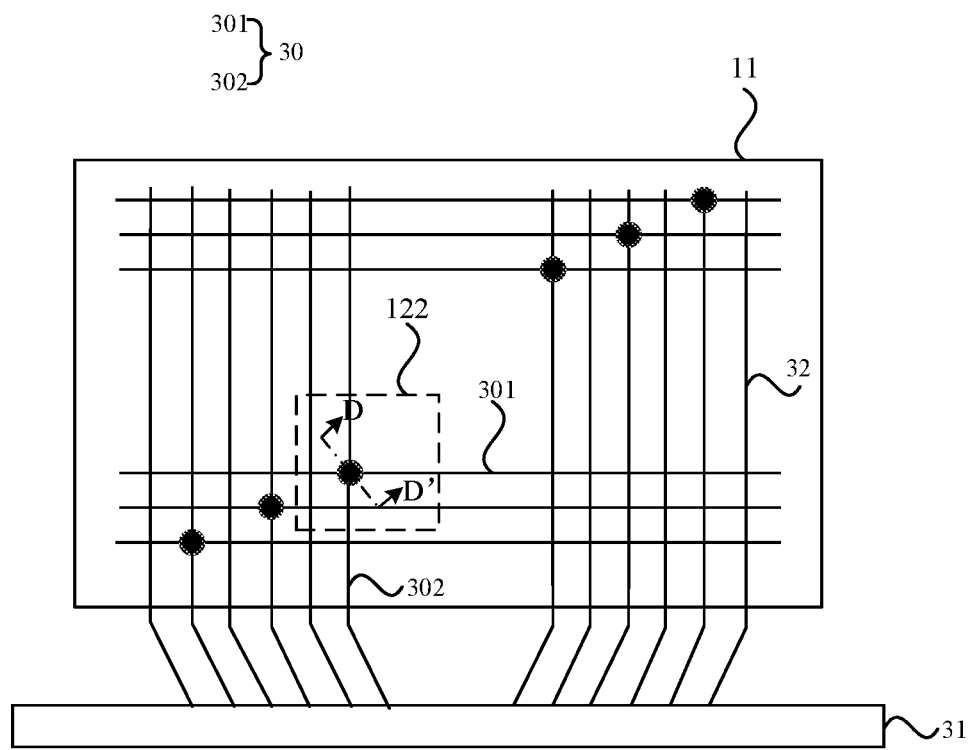
FIG. 19 is a structural view of another display panel according to an embodiment of the present disclosure.
Figure 20:
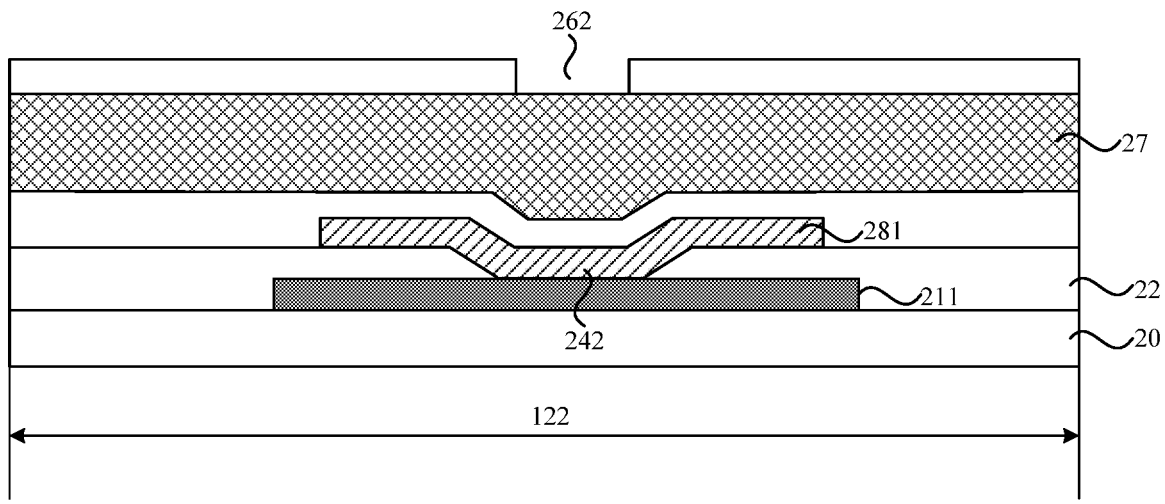
FIG. 20 is a sectional view of a display panel in FIG. 19 along a section line D-D'.
Figure 21:
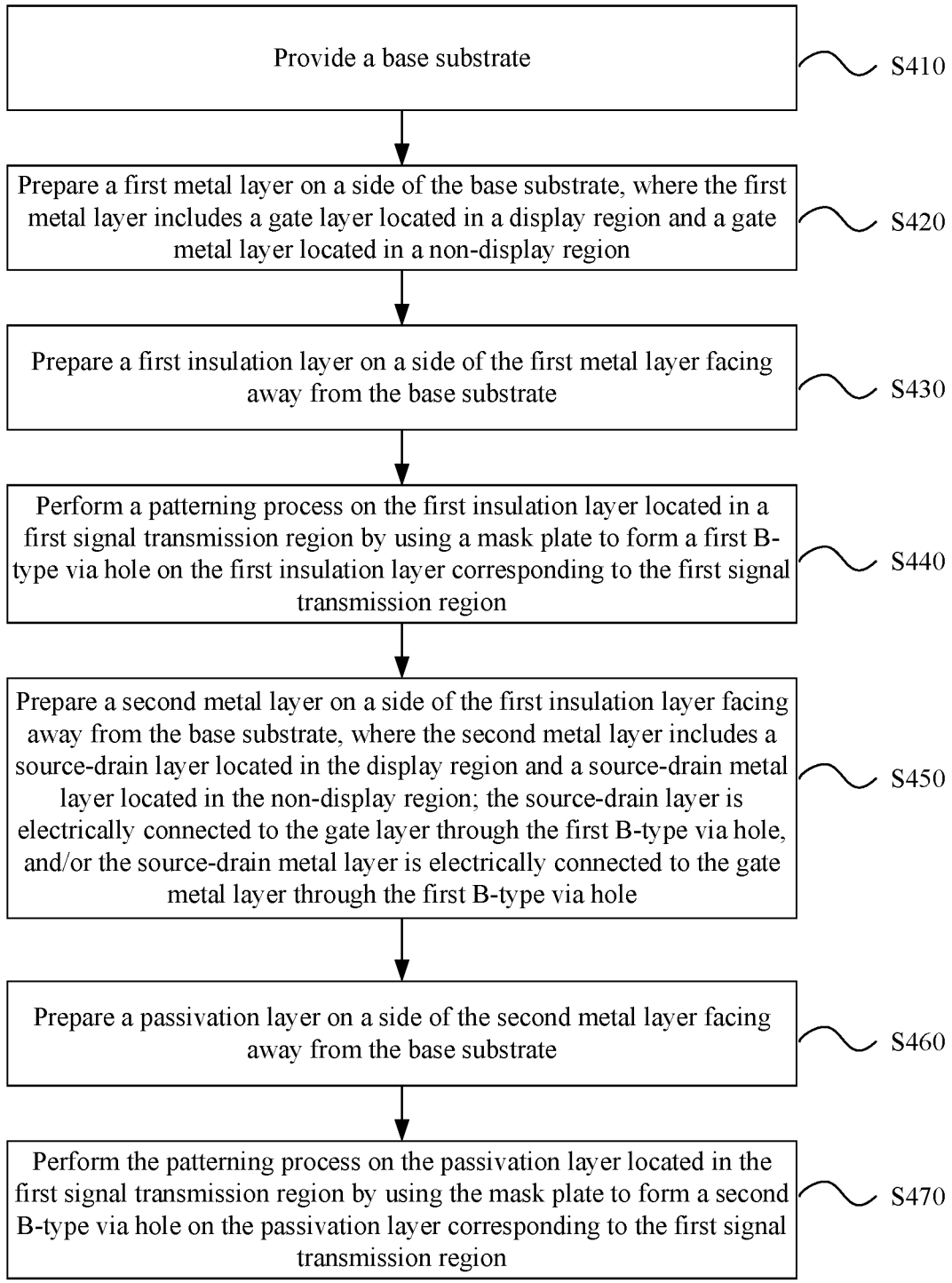
FIG. 21 is a flowchart of another preparation method of a display panel according to an embodiment of the present disclosure.

FIG. 17 is a schematic view of a partial circuit elements in a first signal transmission region in FIG. 13. FIG. 18 is a sectional view of the circuit elements in FIG. 17 along a section line C-C'. FIG. 19 is a structural view of another display panel according to an embodiment of the present disclosure. FIG. 20 is a sectional view of a display panel in FIG. 19 along a section line D-D'. FIG. 21 is a flowchart of another preparation method of a display panel according to an embodiment of the present disclosure, and the preparation method of a display panel in FIG. 21 is a preparation method with respect to the first signal transmission region. As shown in FIG. 21, the preparation method of a display panel according to the embodiments of the present disclosure may include steps described below.

In S410, a base substrate is provided.

In S420, a first metal layer is prepared on the side of the base substrate. The first metal layer includes a gate layer located in the display region and a gate metal layer located in the non-display region.

In S430, a first insulation layer is prepared on the side of the first metal layer facing away from the base substrate.

In S440, a patterning process is performed on the first insulation layer located in the first signal transmission region by using the mask plate to form a first B-type via hole in the first insulation layer corresponding to the first signal transmission region.

In S450, a second metal layer is prepared on the side of the first insulation layer facing away from the base substrate. The second metal layer includes a source-drain layer located in the display region and a source-drain metal layer located in the non-display region. The source-drain layer is electrically connected to the gate layer through the first B-type via hole, and/or the source-drain metal layer is electrically connected to the gate metal layer through the first B-type via hole.

Exemplarily, as shown in FIGS. 13 and 19, a first signal transmission region 122 may be located in the display region 11 or in the non-display region 12, which is not limited in the embodiments of the present disclosure. The first signal transmission region 122 may be understood as a region where the first metal layer 21 and the second metal layer 28 are connected through a first B-type via hole 242 to transmit signals. Normal signal transmission is ensured by causing the first metal layer 21 and the second metal layer 28 to be connected through the first B-type via hole 242.

Specifically, as shown in FIGS. 13, 17, and 18, when the first signal transmission region 122 is located in the non-display region 12, the first signal transmission region 122 may be located in an amorphous silicon gate (ASG) drive circuit or in a vertical shift register (VSR) circuit. FIG. 17 shows an example of a feasible partial ASG circuit for description. As shown in FIG. 17, a gate of a thin film transistor T2 is electrically connected to a source (drain) of a thin film transistor T3, so in the practical display panel, a via hole needs to be formed in a region where the thin film transistor T2 and the thin film transistor T3 are electrically connected, to achieve an electrical connection between the gate of the thin film transistor T2 and the source (drain) of the thin film transistor T3. As shown in FIG. 18, the source-drain metal layer 282 located in the first signal transmission region 122 is electrically connected to the gate metal layer 212 located in the first signal transmission region 122 through the first B-type via hole 242 to ensure the normal operation of the display panel.

Specifically, as shown in FIGS. 19 and 20, when the first signal transmission region 122 is located in the display region 11, the display panel may be a display panel with a vertical gate structure (VGIP). As shown in FIG. 19, scan lines 30 includes a first scan section 301 and a second scan section 302, where the first scan section 301 is horizontally disposed, the second scan section 302 is vertically disposed, and the second scan section 302 is electrically connected to a drive IC 31. A scan signal provided by the drive IC 31 is transmitted to the first scan section 301, enabling an entire row of pixel cells (not shown) connected to the first scan section 301 to be turned on. A VGIP design, shown in FIG. 19, may change transmissions through scan lines extending along a row direction to transmissions through scan lines extending along a column direction, which, in this case, is the same as an extension direction of the data lines. The drive IC may be disposed in the extension direction of the data lines, and the drive IC electrically connected to the scan lines is avoided being disposed in an extension direction of the scan lines, so that a frame designed in the extension direction of the scan lines can be reduced, facilitating a narrow frame design of the display panel. As shown in FIG. 19, the second scan section 302 is disposed in parallel with a data line 32, and in the practical design of the display panel, the second scan section 302 and the data line 32 may be arranged in the same layer, which facilitates the thinning of the display panel. To achieve an electrical connection between the first scan section 301 and the second scan section 302, a via hole needs to be disposed in an overlapping region of the first metal layer 21 and the second metal layer 28. As shown in FIG. 20, the source-drain layer 281 located in the first signal transmission region 122 is electrically connected to the gate layer 211 located in the first signal transmission region 122 through the first B-type via hole 242, ensuring normal transmission of the scan signal and a normal display of the display panel.

In S460, a passivation layer is prepared on the side of the second metal layer facing away from the base substrate.

In S470, a patterning process is performed on the passivation layer located in the first signal transmission region by using the mask plate to form a second B-type via hole in the passivation layer corresponding to the first signal transmission region.

As shown in FIGS. 18 and 20, since the patterning process is performed by using the same mask plate on the first insulation layer 22 and the passivation lay 25, corresponding to a process of the first B-type via hole 242, a second B-type via hole 262 is formed in the passivation layer 25, and a vertical projection of the first B-type via hole 242 on the plane where the base substrate 20 is located covers a vertical projection of the second B-type via hole 262 on the plane where the base substrate 20 is located.

Furthermore, since only the first B-type via hole 242 is needed to achieve the electrical connection between the first metal layer 21 and the second metal layer 28, the patterning process does not need to be performed on a region of the planarization layer 27 corresponding to the second B-type via hole 262, and the second via hole 262 on the planarization layer 27 does not affect the electrical connections between different films in the display panel and the reliability of the display panel.

Next, a second signal transmission region is used as an example for description.

First, an example in which the common electrode is located on a side of the pixel electrode facing away from the base substrate is used for description.

Figure 22:
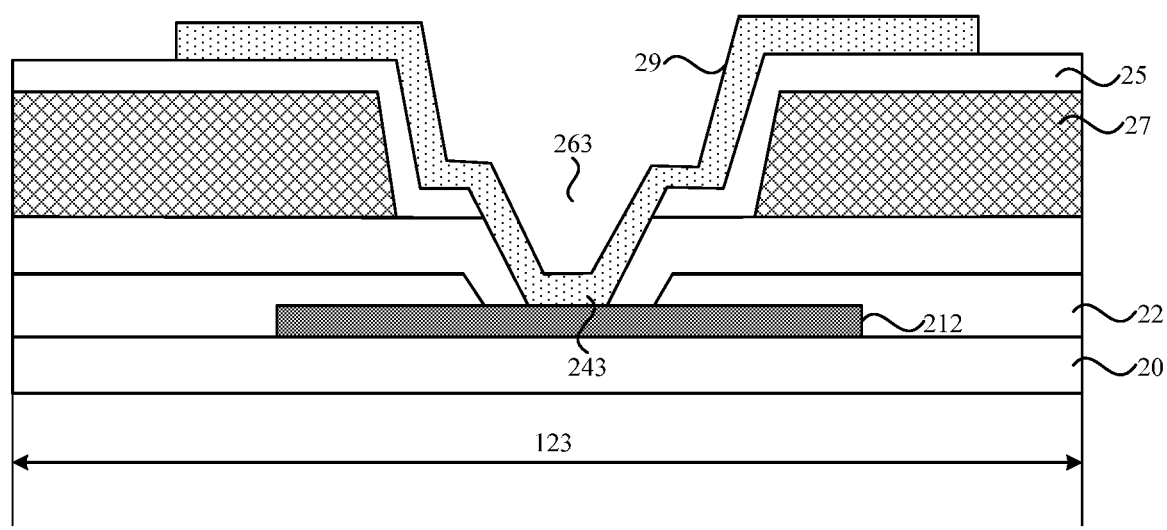
FIG. 22 is a sectional view of a display panel in FIG. 13 along a section line E-E'.
Figure 23:
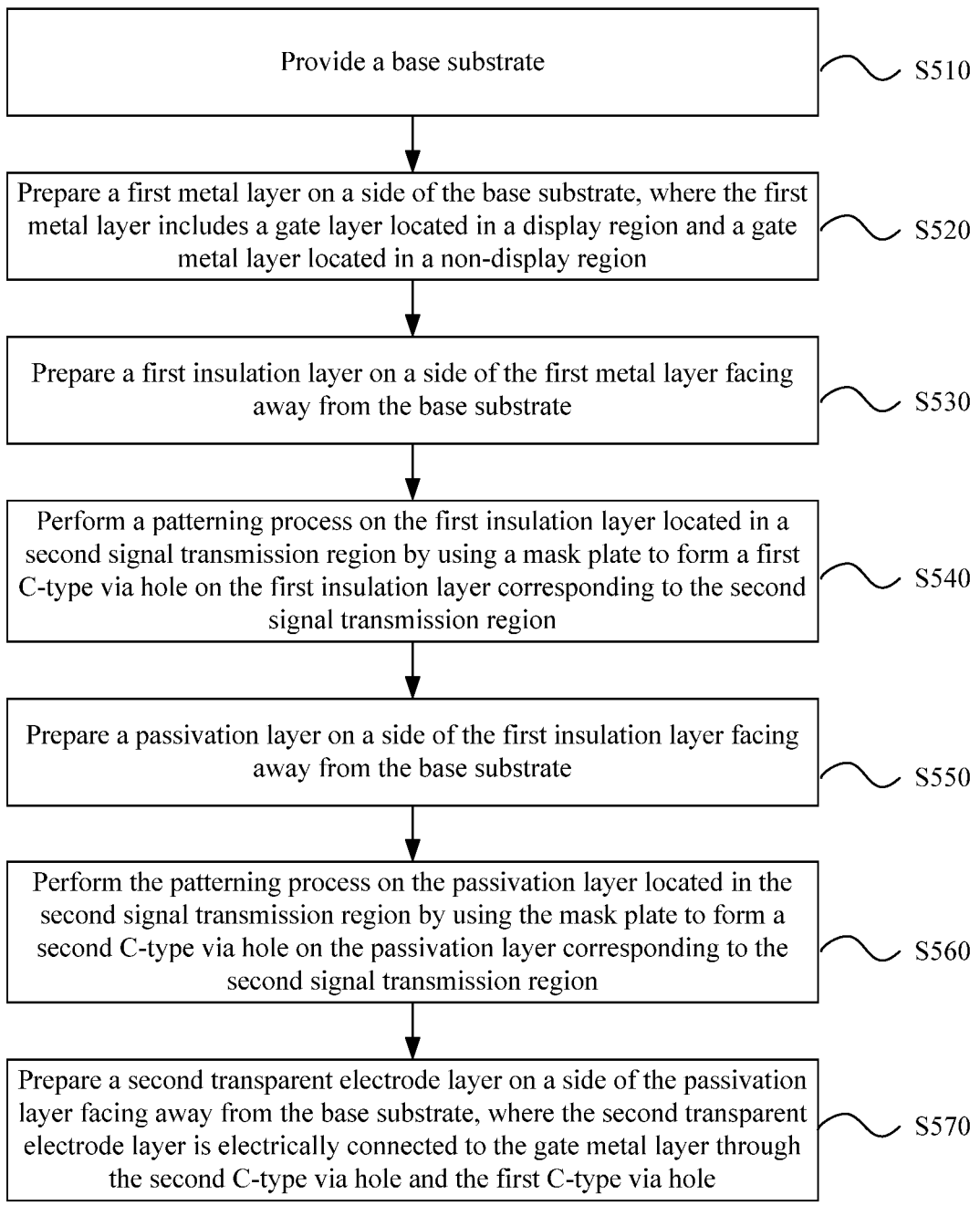
FIG. 23 is a flowchart of another preparation method of a display panel according to an embodiment of the present disclosure.

FIG. 22 is a sectional view of a display panel in FIG. 13 along a section line E-E. FIG. 23 is a flowchart of another preparation method of a display panel according to an embodiment of the present disclosure. The preparation method of a display panel in FIG. 23 is a preparation method with respect to the second signal transmission region in the display panel. As shown in FIG. 23, the preparation method of a display panel according to the embodiments of the present disclosure may include steps described below.

In S510, a base substrate is provided.

In S520, a first metal layer is prepared on the side of the base substrate. The first metal layer includes a gate layer located in the display region and a gate metal layer located in the non-display region.

In S530, a first insulation layer is prepared on the side of the first metal layer facing away from the base substrate.

In S540, a patterning process is performed on the first insulation layer located in the second signal transmission region by using a mask plate to form a first C-type via hole in the first insulation layer corresponding to the second signal transmission region.

In S550, a passivation layer is prepared on the side of the first insulation layer facing away from the base substrate.

In S560, ae patterning process is performed on the passivation layer located in the second signal transmission region by using the mask plate to form a second C-type via hole in the passivation layer corresponding to the second signal transmission region.

A vertical projection of a first C-type via hole 243 on the plane where the base substrate 20 is located covers a vertical projection of the second C-type via hole 263 on the plane where the base substrate 20 is located.

In S570, a second transparent electrode layer is prepared on the side of the passivation layer facing away from the base substrate. The second transparent electrode layer is electrically connected to the gate metal layer through the second C-type via hole and the first C-type via hole.

Exemplarily, FIGS. 2, 13, and 22 illustrate a second transparent electrode 29 as the common electrode for description. As shown in FIGS. 13 and 22, the second signal transmission region 123 may be understood as a region where a common signal is transmitted to the second transparent electrode 29 (i.e., the common electrode). FIGS. 13 and 22 illustrate that the common signal is transmitted to the second transparent electrode 29 through the gate metal layer 212 for description. Specifically, the gate metal layer 212 located in the non-display region 12 may be electrically connected to a terminal for outputting the common signal in the drive IC (not shown), and then the common signal is transmitted to the second transparent electrode 29 through the first C-type via hole 243 and the second C-type via hole 263 to ensure that the second transparent electrode 29 can normally receive the common signal and that the display panel can perform the normal display.

Next, an example in which the common electrode is located on a side of the pixel electrode facing towards the base substrate is used for description, and the second signal transmission region and a third signal transmission region need to be described here.

Figure 24:
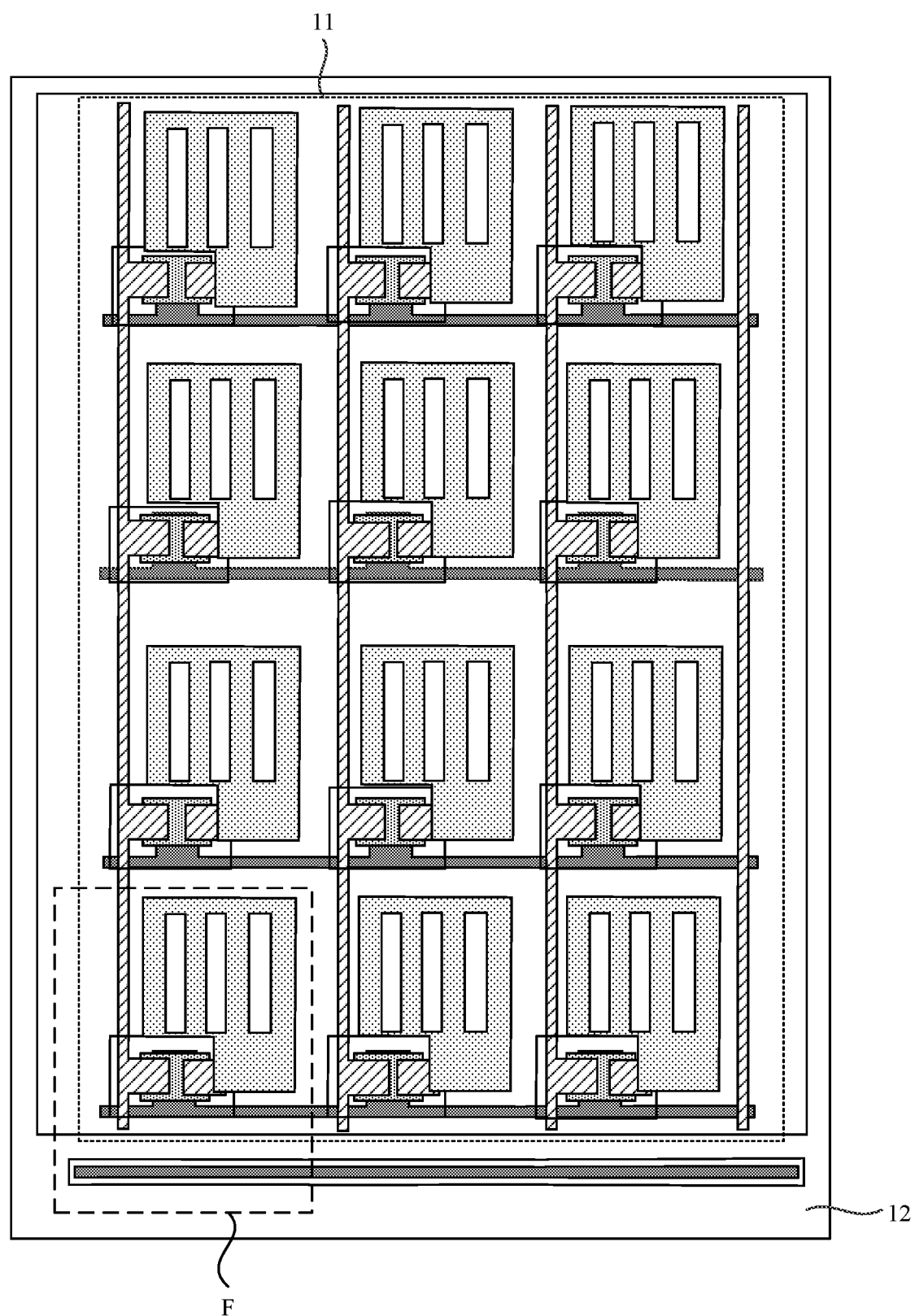
FIG. 24 is a structural view of another display panel according to an embodiment of the present disclosure.
Figure 25:
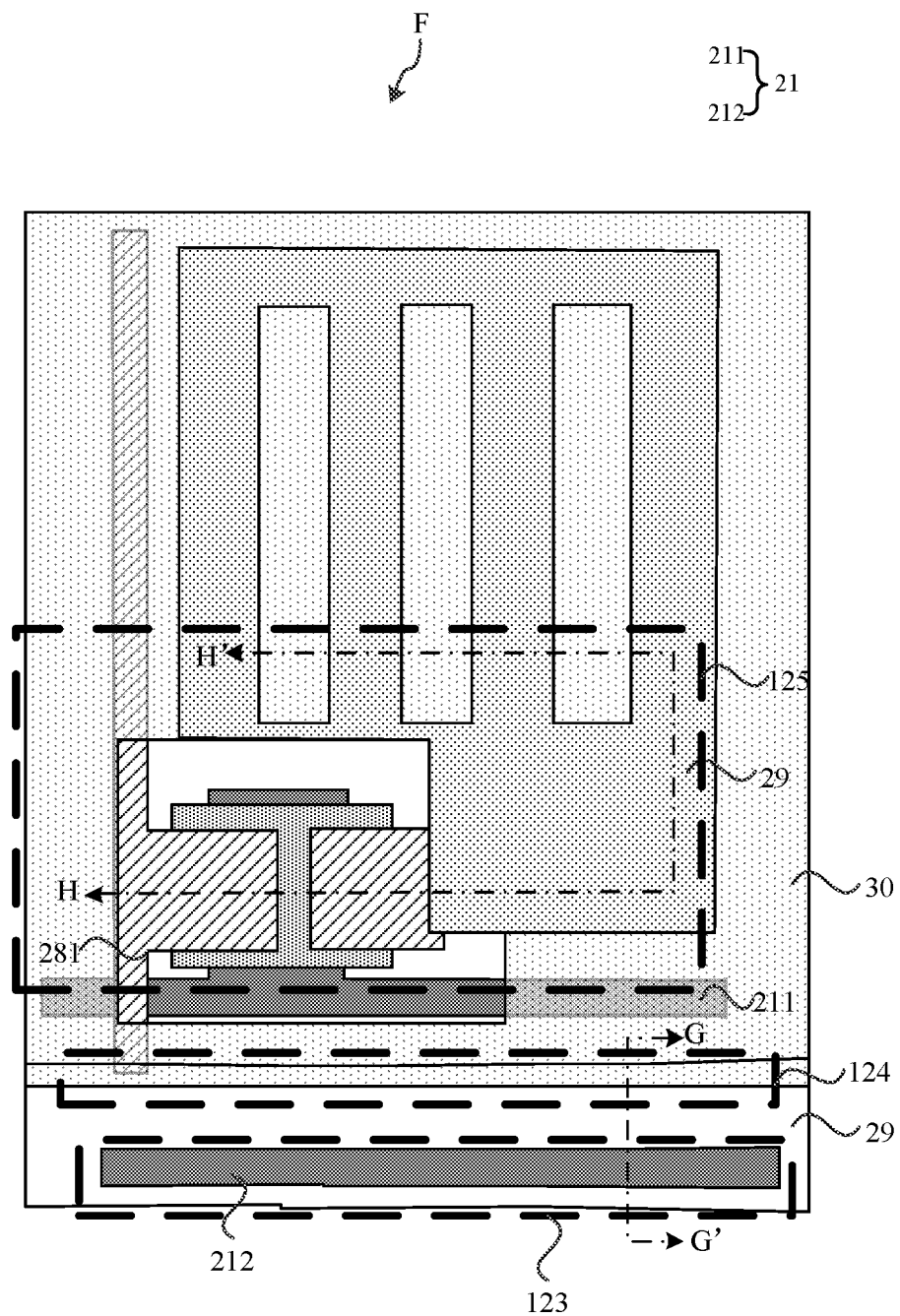
FIG. 25 is an enlarged view of a region F in FIG. 24.
Figure 26:
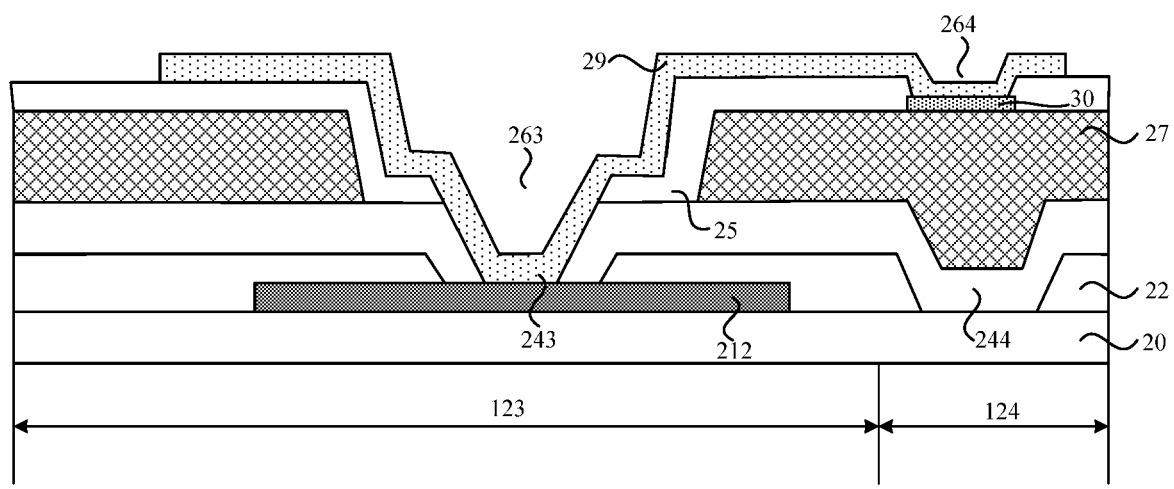
FIG. 26 is a sectional view of a display panel in FIG. 25 along a section line G-G'.
Figure 27:
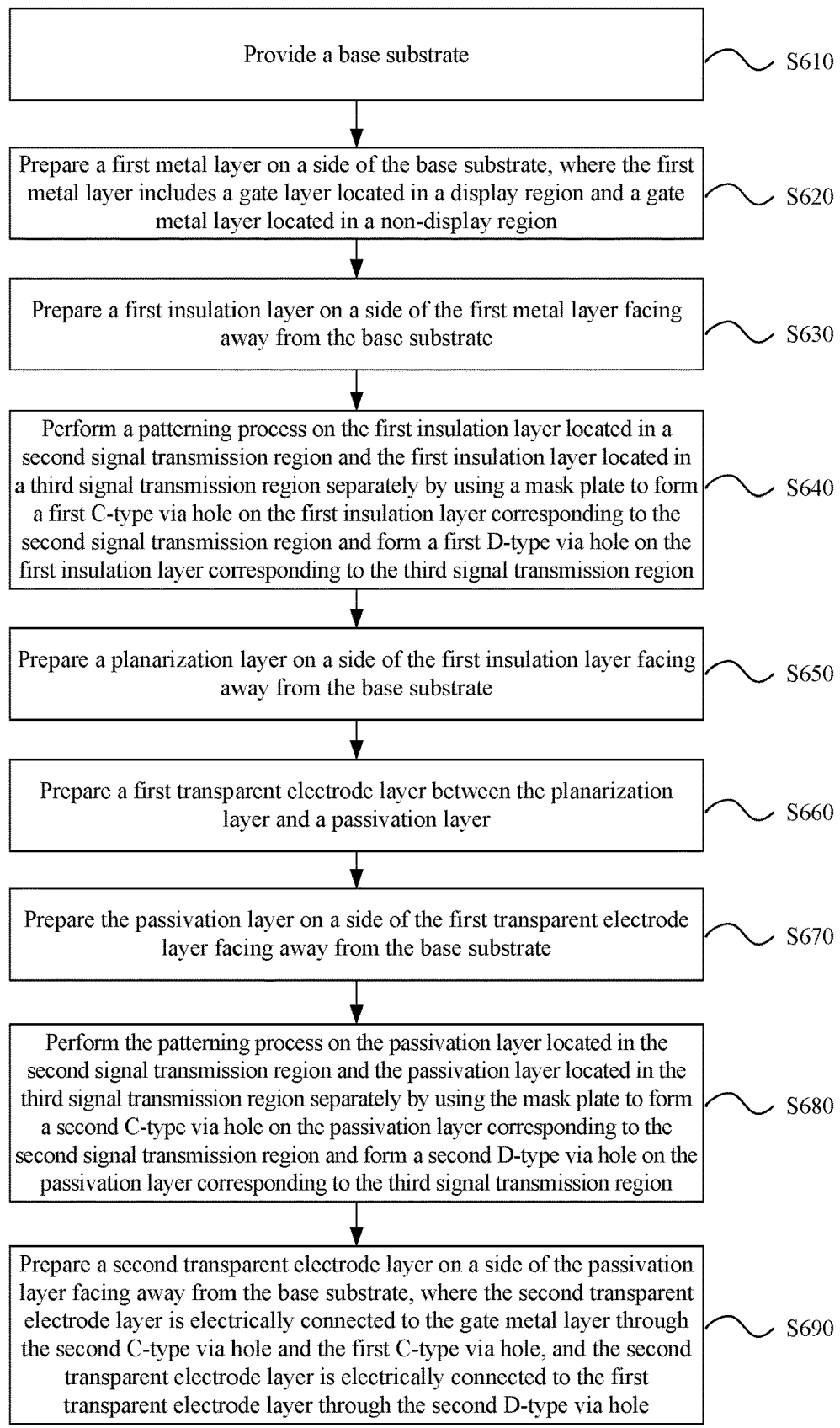
FIG. 27 is a flowchart of another preparation method of a display panel according to an embodiment of the present disclosure.

FIG. 24 is a structural view of another display panel according to an embodiment of the present disclosure. FIG. 25 is an enlarged view of a region F in FIG. 24. FIG. 26 is a sectional view of a display panel in FIG. 25 along a section line G-G'. FIG. 27 is a flowchart of another preparation method of a display panel according to an embodiment of the present disclosure. The preparation method of a display panel in FIG. 27 is a preparation method with respect to the second signal transmission region and the third signal transmission region in the display panel. As shown in FIG. 27, the preparation method of a display panel according to the embodiments of the present disclosure may include steps described below.

In S610, a base substrate is provided.

In S620, a first metal layer is prepared on the side of the base substrate. The first metal layer includes a gate layer located in the display region and a gate metal layer located in the non-display region.

In S630, a first insulation layer is prepared on the side of the first metal layer facing away from the base substrate.

In S640, a patterning process is performed on the first insulation layer located in the second signal transmission region and the first insulation layer located in the third signal transmission region by using the mask plate separately to form the first C-type via hole in the first insulation layer corresponding to the second signal transmission region and form a first D-type via hole in the first insulation layer corresponding to the third signal transmission region.

In S650, a planarization layer is prepared on the side of the first insulation layer facing away from the base substrate.

In S660, a first transparent electrode layer is prepared between the planarization layer and the passivation layer.

In S670, the passivation layer is prepared on a side of the first transparent electrode layer facing away from the base substrate.

In S680, a patterning process is performed on the passivation layer located in the second signal transmission region and the passivation layer located in the third signal transmission region by using the mask plate separately to form the second C-type via hole in the passivation layer corresponding to the second signal transmission region and form a second D-type via hole in the passivation layer corresponding to the third signal transmission region.

The vertical projection of the first C-type via hole 243 on the plane where the base substrate 20 is located covers the vertical projection of the second C-type via hole 263 on the plane where the base substrate is located, and a vertical projection of a first D-type via hole 244 on the plane where the base substrate is located covers a vertical projection of a second D-type via hole 264 on the plane where the base substrate 20 is located.

In S690, a second transparent electrode layer is prepared on the side of the passivation layer facing away from the base substrate. The second transparent electrode layer is electrically connected to the gate metal layer through the second C-type via hole and the first C-type via hole, and the second transparent electrode layer is electrically connected to the first transparent electrode layer through the second D-type via hole.

Exemplarily, FIGS. 24, 25, and 26 illustrate that the second transparent electrode 29 is the pixel electrode, and a first transparent electrode 30 is the common electrode for description. As shown in FIGS. 24, 25, and 26, the second signal transmission region 123 may be understood as the region where the common signal is transmitted to the second transparent electrode 29 (i.e., the pixel electrode), and the third signal transmission region 124 may be understood as a region where the common signal is transmitted to the first transparent electrode (i.e., the common electrode) from the second transparent electrode 29 (i.e., the pixel electrode). FIGS. 24, 25, and 26 illustrate that the common signal is transmitted to the second transparent electrode 29 through the gate metal layer 212 for description. Specifically, the gate metal layer 212 located in the non-display region 12 may be electrically connected to the terminal for outputting the common signal in the drive IC (not shown), the common signal is transmitted to the second transparent electrode 29 through the first C-type via hole 243 and the second C-type via hole 263, and then the second transparent electrode 29 transmits the common signal to the first transparent electrode 30 through the second D-type via hole 264 to ensure that the first transparent electrode 30 can normally receive the common signal and that the display panel can perform the normal display.

As shown in FIG. 26, since the patterning process is performed by using the same mask plate on the first insulation layer 22 and the passivation lay 25, corresponding to a process of the second D-type via hole 264, the first D-type via hole 244 is formed in the first insulation layer 22, and the vertical projection of the first D-type via hole 244 on the plane where the base substrate 20 is located covers the vertical projection of the second D-type via hole 264 on the plane where the base substrate 20 is located.

Next, the fourth signal transmission region is used as an example for description.

Figure 28:
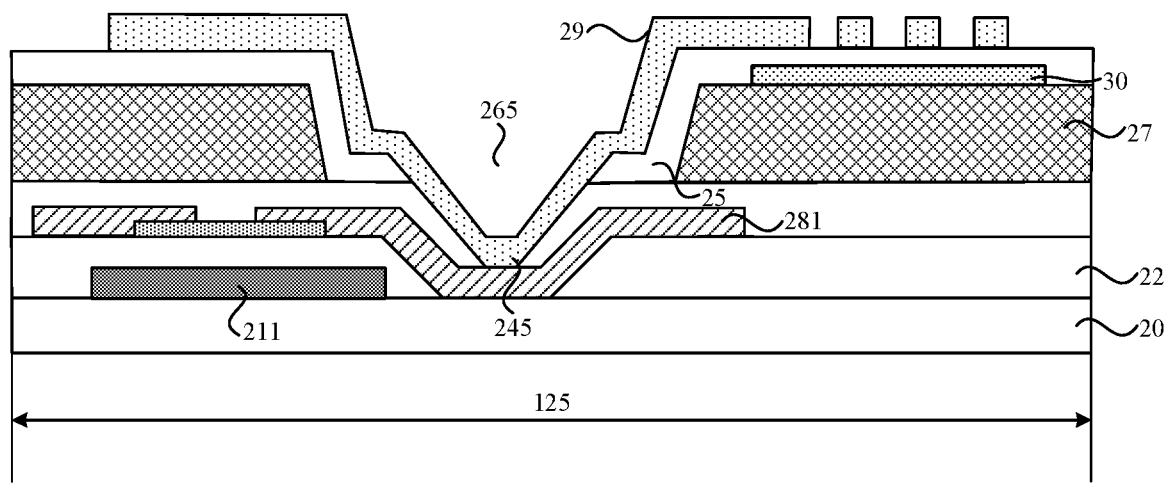
FIG. 28 is a sectional view of a display panel in FIG. 25 along a section line H-H'.
Figure 29:
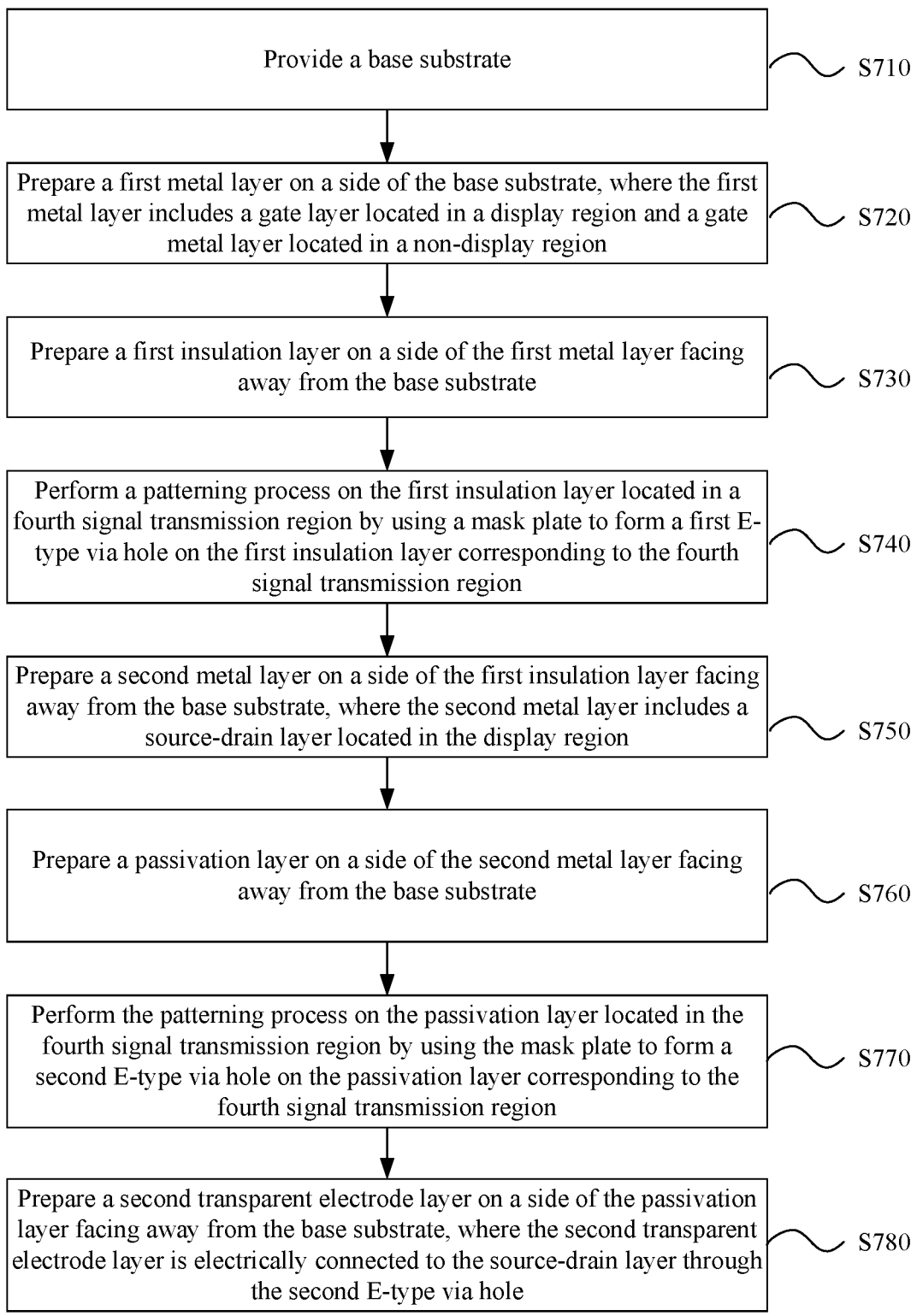
FIG. 29 is a flowchart of another preparation method of a display panel according to an embodiment of the present disclosure.

FIG. 28 is a sectional view of a display panel in FIG. 25 along a section line H-H'. FIG. 29 is a flowchart of another preparation method of a display panel according to an embodiment of the present disclosure. The preparation method of a display panel in FIG. 29 is a preparation method with respect to the fourth signal transmission region in the display panel. As shown in FIG. 29, the preparation method of a display panel according to the embodiments of the present disclosure may include steps described below.

In S710, a base substrate is provided.

In S720, a first metal layer is prepared on the side of the base substrate. The first metal layer includes a gate layer located in the display region and a gate metal layer located in the non-display region.

In S730, a first insulation layer is prepared on the side of the first metal layer facing away from the base substrate.

In S740, a patterning process is performed on the first insulation layer located in the fourth signal transmission region by using a mask plate to form a first E-type via hole in the first insulation layer corresponding to the fourth signal transmission region.

In S750, a second metal layer is prepared on the side of the first insulation layer facing away from the base substrate. The second metal layer includes a source-drain layer located in the display region.

In S760, a passivation layer is prepared on the side of the second metal layer facing away from the base substrate.

In S770, a patterning process is performed on the passivation layer located in the fourth signal transmission region by using the mask plate to form a second E-type via hole in the passivation layer corresponding to the fourth signal transmission region.

A vertical projection of a first E-type via hole 245 on the plane where the base substrate 20 is located covers a vertical projection of a second E-type via hole 265 on the plane where the base substrate 20 is located.

In S780, a second transparent electrode layer is prepared on the side of the passivation layer facing away from the base substrate. The second transparent electrode layer is electrically connected to the source-drain layer through the second E-type via hole.

Exemplarily, as shown in FIGS. 25 and 28, a fourth signal transmission region 125 may be understood as a region where the thin film transistor is electrically connected to the pixel electrode to transmit a display signal. As shown in FIG. 28, the second transparent electrode 29 (i.e., the pixel electrode) is electrically connected to the source-drain layer 281 through the second E-type via hole 265 to receive the display signal and ensure that the display panel can perform the normal display.

As shown in FIG. 28, since the patterning process is performed by using the same mask plate on the first insulation layer 22 and the passivation layer 25, corresponding to a process of the second E-type via hole 265, the first E-type via hole 245 is formed in the first insulation layer 22, and the vertical projection of the first E-type via hole 245 on the plane where the base substrate 20 is located covers the vertical projection of the second E-type via hole 265 on the plane where the base substrate 20 is located.

Furthermore, the liquid crystal display panel in the transverse electric field mode may be prepared by the preparation method of a display panel according to the embodiments of the present disclosure. As shown in FIG. 28, to ensure that a transparent electrode closer to liquid crystals can normally drive the liquid crystals to deflect, a plurality of independent transparent sub-electrodes, indicated by dashed lines in the figure, may be formed in the second transparent electrode 29, which is the transparent electrode closer to the liquid crystals, to ensure that an electric field signal generated by the second transparent electrode 29 can pass through the liquid crystals and drive the liquid crystals to deflect and that the display panel can perform the normal display.

It should be noted that the embodiments of the present disclosure do not limit a specific form of the liquid crystal display panel, and only a fringe field switching (FFS) form is used as an example for description.

To sum up, from the above-mentioned description of the preparation methods with respect to different regions of the display panel, the feasibility of performing the patterning process by using the same mask plate on the first insulation layer and the passivation layer in the preparation methods of the display panel according to the embodiments of the present disclosure can be fully understood. The patterning process is configured to be performed by using the same mask plate on the first insulation layer and the passivation layer, which does not affect the normal operation of the display panel and ensures the normal electrical connections between different films, but also can reduce the costs for purchasing one mask plate and reduce the preparation costs of the entire display panel at the process development and mass production stages, so that the display panel has good practicability.

It is to be understood that since the first via holes are formed in the first insulation layer, when the other films are prepared above the first insulation layer, the alignment accuracy of the other films will be affected due to the existence of the first via holes, and how to solve the problem of influence of the first via holes on the alignment accuracy of the other films is described below.

A feasible implementation is described.

Optionally, in the preparation method of a display panel according to the embodiments of the present disclosure, the steps of preparing the planarization layer on the side of the first insulation layer facing away from the base substrate may include: preparing the planarization layer on the side of the first insulation layer facing away from the base substrate, where the planarization layer fills the first via holes.

Figure 30:
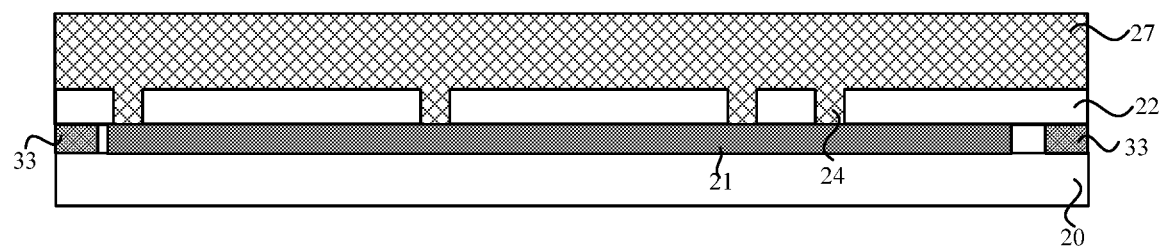
FIG. 30 is a sectional view of FIG. 12 along a section line I-I'.

Exemplarily, FIG. 30 is a sectional view of FIG. 12 along a section line I-I'. As shown in FIG. 30, alignment marks 33 are formed on the base substrate 20. Optionally, the alignment marks 33 and the first metal layer 21 are made of the same material and in the same layer, and the first insulation layer 22 and the planarization layer 27 are both transparent films, so that a film above the planarization layer 27 is aligned directly according to the alignment marks 33 on the base substrate 20. Furthermore, the planarization layer 27 fills the first via holes 24, so that a degree to which a light path is changed at the positions of the first via holes 24 can be reduced, the influence of the first via holes 24 in the first insulation layer 22 on the alignment of the subsequent films can be reduced, and the alignment accuracy of the subsequent films can be improved. Specifically, the influence of the lower films on an alignment accuracy of the upper films in the display panel can be reduced by the first insulation layer 22 and by adjusting an alignment device (e.g., a charge-coupled device (CCD)), improving the preparation yield of the display panel.

Another feasible implementation is described.

Figure 31:
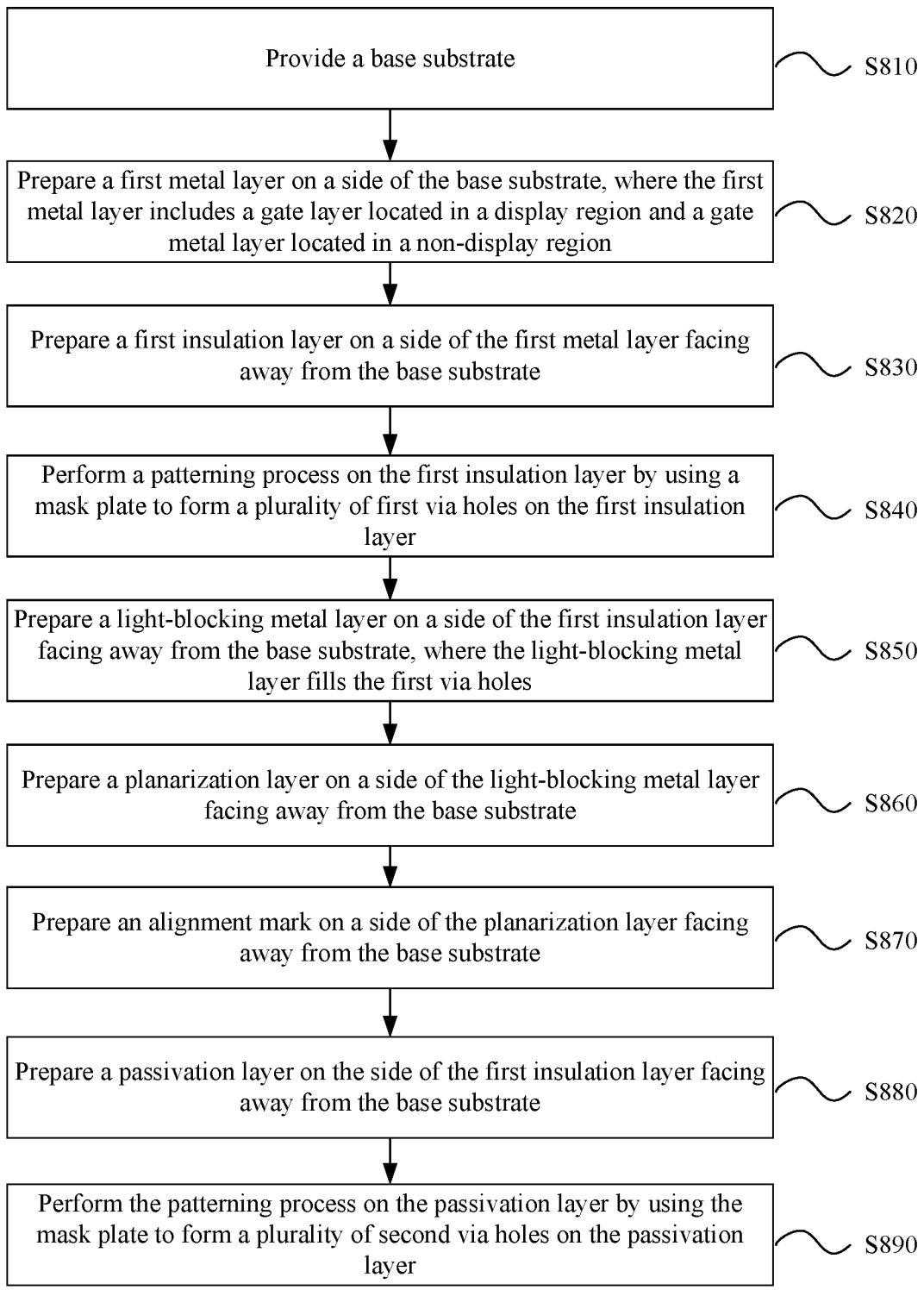
FIG. 31 is a flowchart of another preparation method of a display panel according to an embodiment of the present disclosure.

FIG. 31 is a flowchart of another preparation method of a display panel according to an embodiment of the present disclosure. As shown in FIG. 31, the preparation method of a display panel according to the embodiments of the present disclosure may include steps described below.

In S810, a base substrate is provided.

In S820, a first metal layer is prepared on the side of the base substrate. The first metal layer includes a gate layer located in the display region and a gate metal layer located in the non-display region.

In S830, a first insulation layer is prepared on the side of the first metal layer facing away from the base substrate.

In S840, a patterning process is performed on the first insulation layer by using the mask plate to form the plurality of first via holes in the first insulation layer.

In S850, a light-blocking metal layer is prepared on the side of the first insulation layer facing away from the base substrate. The light-blocking metal layer fills the first via holes.

Figure 32:
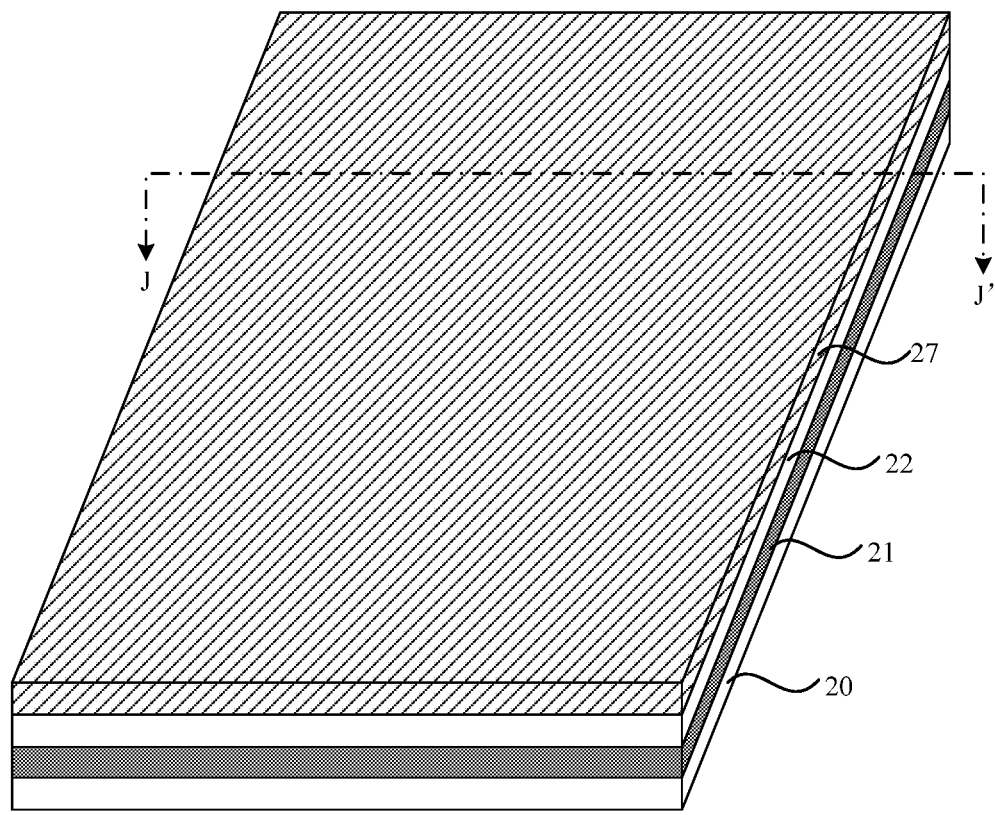
FIG. 32 is a structural view of a light-blocking metal layer prepared according to an embodiment of the present disclosure.
Figure 33:
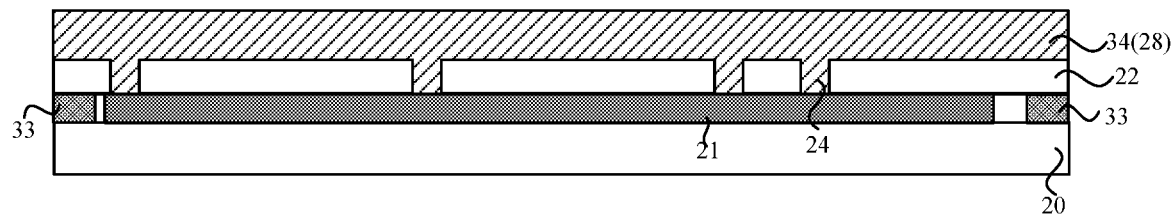
FIG. 33 is a sectional view of FIG. 32 along a section line J-J'.

FIG. 32 is a structural view of a light-blocking metal layer prepared according to an embodiment of the present disclosure. FIG. 33 is a sectional view of FIG. 32 along a section line J-J'. As shown in FIGS. 32 and 33, a light-blocking metal layer 34 completely covers the first insulation layer 22 and fills the first via holes 24 in the first insulation layer 22. Since the light-blocking metal layer 34 has a good capability of reflecting light, most of light rays incident onto the light-blocking metal layer 34 are reflected to a side of the base substrate 20, and few light rays change their paths at the positions of the first via holes 24. Therefore, the problem of the influence of the first via holes 24 on the alignment accuracy of the films above the first via holes 24 can be neglected, so that the high alignment accuracy of the films above the first via holes 24 can be ensured.

Optionally, the light-blocking metal layer 34 may be reused as the second metal layer 28 to ensure that the display panel has simple films and a simple preparation process.

In S860, a planarization layer is prepared on the side of the light-blocking metal layer facing away from the base substrate.

In S870, alignment marks are prepared on the side of the planarization layer facing away from the base substrate.

Figure 34:
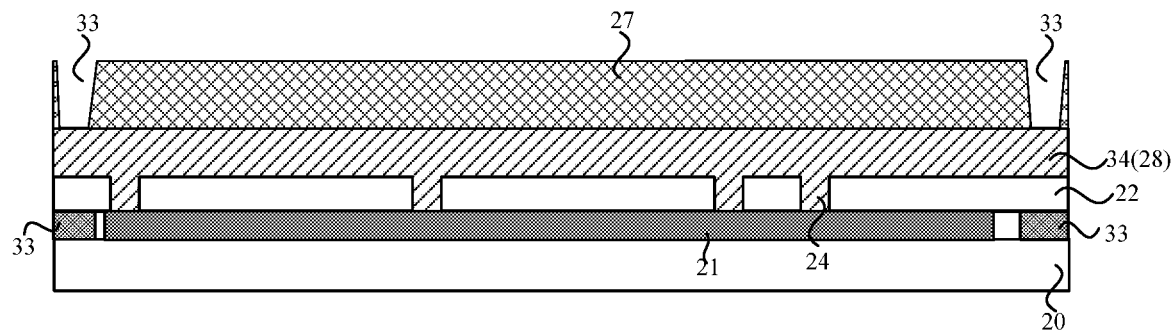
FIG. 34 is a structural view of an alignment mark prepared on a planarization layer according to an embodiment of the present disclosure.

FIG. 34 is a structural view of an alignment mark prepared on a planarization layer according to an embodiment of the present disclosure. As shown in FIG. 34, due to an opaque property of the light-blocking metal layer 34, the alignment mark 33 on the base substrate 20 is covered by the light-blocking metal layer 34. To avoid affecting normal alignment of a film above the light-blocking metal layer 34, the alignment mark 33 is formed again on the planarization layer 27 in the embodiments of the present disclosure, and the newly-formed alignment mark 33 is a via hole structure formed on the planarization layer. The films above the planarization layer 27 may be accurately aligned by the alignment mark 33 on the planarization layer 27, ensuring the high alignment accuracy of the films of the display panel, avoiding risks of ramps and broken lines of some films at positions of via holes, and improving the preparation yield of the display panel. It should be noted that one function of the alignment marks is to ensure the accurate alignment of via holes in the passivation layer and the planarization layer; if the passivation layer 25 and the planarization layer 27 are inaccurately aligned, an etching error of the passivation layer 25 easily occurs at positions of via holes, resulting in a phenomenon of ramps of an electrode layer located on the side of the passivation layer 25 facing away from the base substrate 20 and causing the risk of broken lines.

In S880, the passivation layer is prepared on the side of the first insulation layer facing away from the base substrate.

In S890, a patterning process is performed on the passivation layer by using the mask plate to form the plurality of second via holes in the passivation layer.

To sum up, the above-mentioned embodiments describes how to reduce or eliminate the influence of the first via holes on the alignment accuracy of other films by two feasible implementations, so as to ensure the high alignment accuracy of the films of the display panel and the high preparation yield of the display panel.

Figure 35:
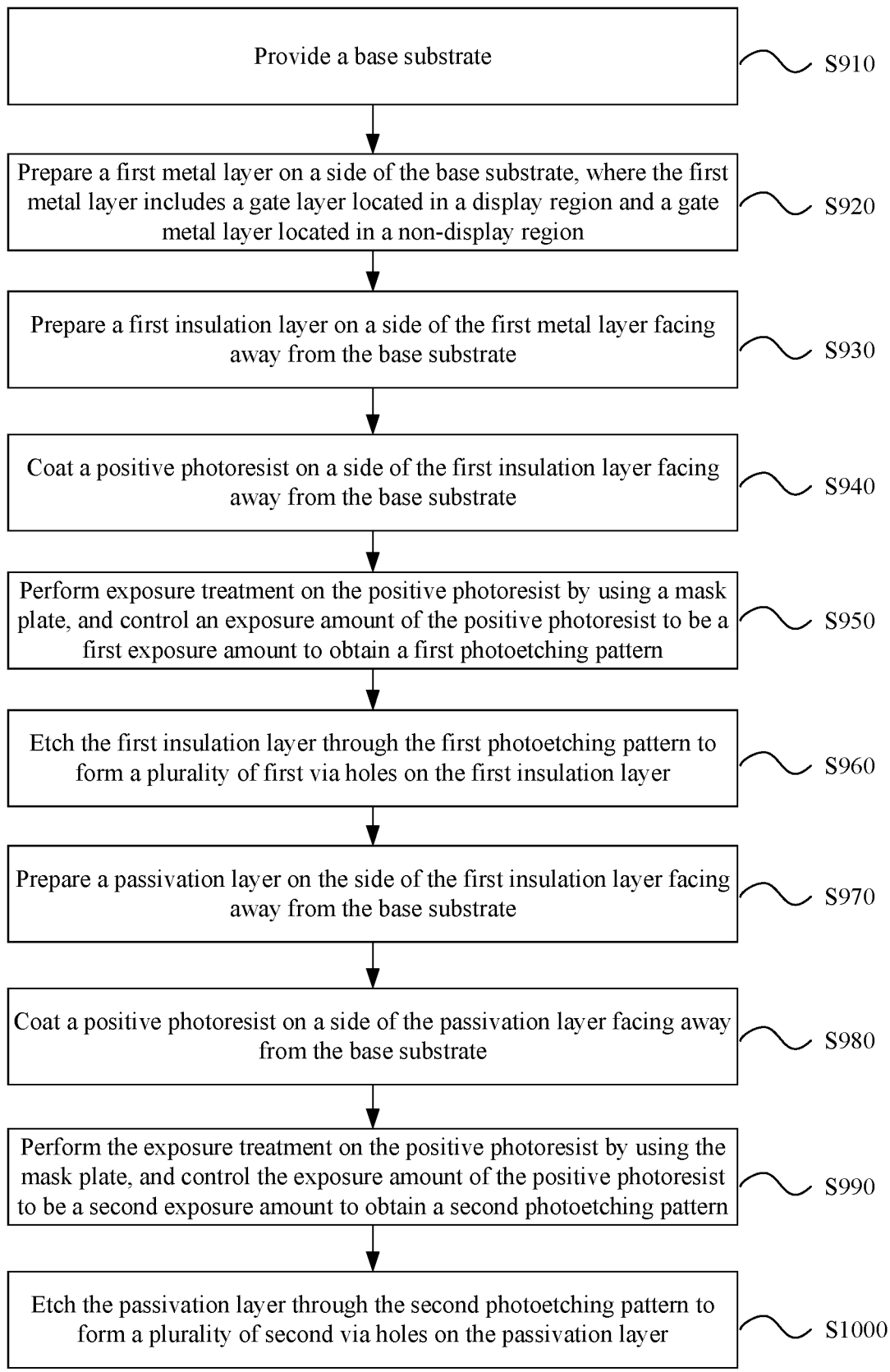
FIG. 35 is a flowchart of another preparation method of a display panel according to an embodiment of the present disclosure.

FIG. 35 is a flowchart of another preparation method of a display panel according to an embodiment of the present disclosure. As shown in FIG. 35, the preparation method of a display panel according to the embodiments of the present disclosure includes steps described below.

In S910, a base substrate is provided.

In S920, a first metal layer is prepared on the side of the base substrate. The first metal layer includes a gate layer located in the display region and a gate metal layer located in the non-display region.

In S930, a first insulation layer is prepared on the side of the first metal layer facing away from the base substrate.

In S940, a positive photoresist is coated on the side of the first insulation layer facing away from the base substrate.

In S950, exposure treatment is performed on the positive photoresist by using the mask plate, and an exposure amount of the positive photoresist is controlled to be a first exposure amount to obtain a first photoetching pattern.

In S960, the first insulation layer is etched through the first photoetching pattern to form the plurality of first via holes in the first insulation layer.

In S970, a passivation layer is prepared on the side of the first insulation layer facing away from the base substrate.

In S980, the positive photoresist is coated on the side of the passivation layer facing away from the base substrate.

In S990, the exposure treatment is performed on the positive photoresist by using the mask plate, and the exposure amount of the positive photoresist is controlled to be a second exposure amount to obtain a second photoetching pattern.

In S1000, the passivation layer is etched through the second photoetching pattern to form the plurality of second via holes in the passivation layer.

Exemplarily, since the first via holes are located on a side of the second via holes facing towards the base substrate, to avoid ramps and broken lines of the other films at positions of the first via holes and the second via holes, in the embodiments of the present disclosure, not only the vertical projection of the first via hole on the base substrate covers the vertical projection of the second via hole on the base substrate, but also an area of the vertical projection of the first via hole on the plane where the base substrate is located is greater than an area of the vertical projection of the second via hole on the plane where the base substrate is located, ensuring gentle ramps of the other films in regions corresponding to the first via holes and the second via holes, that broken lines of the other films do not occur in the regions corresponding to the first via holes and the second via holes, and that the display panel can perform the normal operation and display without being affected by the first via holes and the second via holes.

Furthermore, since the positive photoresist is used for preparing both the first via holes and the second via holes, to ensure that the area of the vertical projection of the first via hole on the plane where the base substrate is located is greater than the area of the vertical projection of the second via hole on the plane where the base substrate is located, the first exposure amount for preparing the first via holes may be configured to be greater than the second exposure amount for preparing the second via holes, so as to ensure that the area of the vertical projection of the first via hole on the plane where the base substrate is located is greater than the area of the vertical projection of the second via hole on the plane where the base substrate is located and that the broken lines of the other films do not occur in the regions corresponding to the first via holes and the second via holes.

It should be noted that the embodiments of the present disclosure continues being described with only the positive photoresist as an example. When the photoresist is the positive photoresist, the first exposure amount is greater than the second exposure amount. It is to be understood that when a negative photoresist is used for preparing the first via holes and the second via holes, the first exposure amount may be controlled to be smaller than the second exposure amount, which can still ensure that the area of the vertical projection of the first via hole on the plane where the base substrate is located is greater than the area of the vertical projection of the second via hole on the plane where the base substrate is located and that the broken lines of the other films do not occur in the regions corresponding to the first via holes and the second via holes.

Based on the same inventive concept, embodiments of the present disclosure further provide a display panel, which is prepared by the preparation method of a display panel according to the embodiments of the present disclosure. As shown in FIGS. 2, 13 to 15, 18, 20, 22, 24 to 26 and 28, the display panel according to the embodiments of the present disclosure includes a display region 11 and a non-display region 12, and further includes a base substrate 20, a first metal layer 21, a first insulation layer 22 and a passivation layer 25. The first metal layer 21 is located on a side of the base substrate 20, and the first metal layer 21 includes a gate layer 211 in the display region 11 and a gate metal layer 212 in the non-display region 12. The first insulation layer 22 is located on a side of the first metal layer 21 facing away from the base substrate 20, where a plurality of first via holes 24 are formed in the first insulation layer 22. The passivation layer 25 is located on a side of the first insulation layer 22 facing away from the base substrate 20, where a plurality of second via holes 26 are formed in the passivation layer 25, and a vertical projection of each of the first via holes 24 on a plane where the base substrate 20 is located covers a vertical projection of one of the second via holes 26 on the plane where the base substrate 20 is located.

To sum up, in the display panel according to the embodiments of the present disclosure, a patterning process is performed by using a same mask plate on the first insulation layer and the passivation layer to form the first via holes in the first insulation layer and form the second via holes in the passivation layer, thereby reducing costs for purchasing one mask plate and reducing preparation costs of the entire display panel at process development and mass production stages. Furthermore, a vertical projection of the first via hole on the base substrate covers a vertical projection of the second via hole on the base substrate, and electrical connections of films in the display panel are achieved through the first via holes and the second via holes to ensure a normal operation of the display panel.

Optionally, as shown in FIGS. 8 to 10, 12, 14, 15, 18, 20, 22, 26, 28, 30, and 34, the display panel further includes a planarization layer 27 disposed between the first insulation layer 22 and the passivation layer 25. The planarization layer 27 covers the first insulation layer 22. The planarization layer 27 may provide etching protection for the first insulation layer 22 located below the planarization layer 27 and prevent an etching gas from damaging the first insulation layer 22 when the passivation layer 25 is etched with the etching gas. Meanwhile, the planarization layer 27 may also planarize the passivation layer 25 located above the planarization layer 27, thereby improving the planarity of the passivation layer 25.

Optionally, as shown in FIGS. 13 to 15, the non-display region 12 includes a signal terminal providing region 121; the first via holes 24 include a first A-type via hole 241 located in the signal terminal providing region 121; the second via holes 26 include a second A-type via hole 261 located in the signal terminal providing region 121; where a vertical projection of the first A-type via hole 241 on the plane where the base substrate 20 is located covers a vertical projection of the second A-type via hole 261 on the plane where the base substrate 20 is located; the display panel further includes a second metal layer 28 located on the side of the first insulation layer 22 facing away from the base substrate 20 and a second transparent electrode layer 29 located on a side of the passivation layer 25 facing away from the base substrate 20, where the second metal layer 28 includes a source-drain metal layer 282 located in the non-display region 12; the source-drain metal layer 282 is electrically connected to the gate metal layer 212 through the first A-type via hole 241; the second transparent electrode layer 29 is electrically connected to the source-drain metal layer 282 through the second A-type via hole 261.

Exemplarily, the signal terminal providing region 121 may be understood as a region where signal terminals are disposed. The signal terminals may be a signal terminal in a drive IC or a signal terminal in a flexible circuit board, which is not limited in the embodiments of the present disclosure. The patterning process is performed by using the same mask plate on the first insulation layer 22 and the passivation layer 25 to form the first A-type via hole 241 in the first insulation layer 22 and form the second A-type via hole 261 in the passivation layer 25, and the second transparent electrode layer 29 is connected to the source-drain metal layer 282 through the second A-type via hole 261 in the passivation layer 25 to protect the source-drain metal layer 282 reused as the signal terminal from water and oxygen.

Optionally, as shown in FIGS. 17 to 20, the display region 11 and/or the non-display region 12 include a first signal transmission region 122; the first via holes 24 include a first B-type via hole 242 located in the first signal transmission region 122; the second via holes 26 include a second B-type via holes 262 located in the first signal transmission region 122; where a vertical projection of the first B-type via hole 242 on the plane where the base substrate 20 is located covers a vertical projection of the second B-type via hole 262 on the plane where the base substrate 20 is located; the display panel further includes the second metal layer 28 located on the one side of the first insulation layer 22 facing away from the base substrate 20, where the second metal layer 28 includes a source-drain layer 281 in the display region 11 and the source-drain metal layer 282 in the non-display region 12; the source-drain layer 281 is electrically connected to the gate layer 211 through the first B-type via hole 242, and/or the source-drain metal layer 282 is electrically connected to the gate metal layer 212 through the first B-type via hole 242.

Exemplarily, the first signal transmission region 122 may be located in the display region 11 or in the non-display region 12, which is not limited in the embodiments of the present disclosure. The first signal transmission region 122 may be understood as a region where the first metal layer 21 and the second metal layer 28 are connected through the first B-type via hole 242, and the first metal layer 21 and the second metal layer 28 are configured to be connected through the first B-type via hole 242 to ensure normal signal transmission. The patterning process is performed by using the same mask plate on the first insulation layer 22 and the passivation layer 25 to form the first B-type via holes 242 in the first insulation layer 22 and the second B-type via hole 262 in the passivation layer 25, and the first metal layer 21 is connected to the second metal layer 28 through the first B-type via hole 242 to ensure the normal signal transmission and the normal display of the display panel.

Optionally, as shown in FIG. 22, the non-display region 12 includes a second signal transmission region 123; the first via holes 24 include a first C-type via hole 243 located in the second signal transmission region 123; the second via holes 26 includes a second C-type via hole 263 located in the second signal transmission region 123; where a vertical projection of the first C-type via hole 243 on the plane where the base substrate 20 is located covers a vertical projection of the second C-type via hole 263 on the plane where the base substrate 20 is located; the display panel further includes the second transparent electrode layer 29 located on the side of the passivation layer 25 facing away from the base substrate 20; where the second transparent electrode layer 29 is electrically connected to the gate metal layer 212 through the second C-type via hole 263 and the first C-type hole 243.

Exemplarily, FIG. 22 illustrates a second transparent electrode 29 as a common electrode for description. As shown in FIG. 22, the second signal transmission region 123 may be understood as a region where a common signal is transmitted to the second transparent electrode 29 (i.e., the common electrode). FIG. 22 illustrates that the common signal is transmitted to the second transparent electrode 29 through the gate metal layer 212 for description. Specifically, the gate metal layer 212 located in the non-display region 12 may be electrically connected to a terminal for outputting the common signal in the drive IC (not shown), and then the common signal is transmitted to the second transparent electrode 29 through the first C-type via hole 243 and the second C-type via hole 263 to ensure that the second transparent electrode 29 can normally receive the common signal and that the display panel can perform the normal display.

Optionally, as shown in FIGS. 24 to 26, the non-display region 12 includes the second signal transmission region 123 and a third signal transmission region 124; the first via holes 24 include the first C-type via holes 243 located in the second signal transmission region 123 and a first D-type via hole 244 located in the third signal transmission region 124; the second via holes 26 include the second C-type via hole 263 located in the second signal transmission region 123 and a second D-type via hole 264 located in the third signal transmission region 124; where a vertical projection of the first C-type via hole 243 on the plane where the base substrate 20 is located covers a vertical projection of the second C-type via hole 263 on the plane where the base substrate 20 is located, and a vertical projection of the first D-type via hole 244 on the plane where the base substrate 20 is located covers a vertical projection of the second D-type via hole 264 on the plane where the base substrate 20 is located.

The display panel further includes a first transparent electrode layer 30 located between the planarization layer 27 and the passivation layer 25 and the second transparent electrode layer 29 located on the side of the passivation layer 25 facing away from the base substrate 20, where the second transparent electrode layer 29 is electrically connected to the gate metal layer 212 through the second C-type via hole 263 and the first C-type via hole 243, and the second transparent electrode layer 29 is electrically connected to the first transparent electrode layer 30 through the second D-type via hole 264.

Exemplarily, FIGS. 24, 25, and 26 illustrate that the second transparent electrode 29 is a pixel electrode, and a first transparent electrode 30 is the common electrode for description. As shown in FIGS. 24, 25, and 26, the second signal transmission region 123 may be understood as the region where the common signal is transmitted to the second transparent electrode 29 (i.e., the pixel electrode), and the third signal transmission region 124 may be understood as a region where the common signal is transmitted by the second transparent electrode 29 (i.e., the pixel electrode) to the first transparent electrode (i.e., the common electrode). FIGS. 24, 25, and 26 illustrate that the common signal is transmitted to the second transparent electrode 29 through the gate metal layer 212 for description. Specifically, the gate metal layer 212 located in the non-display region 12 may be electrically connected to the terminal for outputting the common signal in the drive IC (not shown), the common signal is transmitted to the second transparent electrode 29 through the first C-type via hole 243 and the second C-type via hole 263, and then the second transparent electrode 29 transmits the common signal to the first transparent electrode 30 through the second D-type via hole 263 to ensure that the first transparent electrode 30 can normally receive the common signal and that the display panel can perform the normal display.

Optionally, as shown in FIG. 28, the display region 11 includes a fourth signal transmission region 125; the first via holes 24 include a first E-type via hole 245 located in the fourth signal transmission region 125; the second via holes 26 include a second E-type via hole 265 located in the fourth signal transmission region 125; where a vertical projection of the first E-type via hole 245 on the plane where the base substrate 20 is located covers a vertical projection of the second E-type via hole 265 on the plane where the base substrate 20 is located; the display panel further includes the second metal layer 28 located on the side of the first metal layer 21 facing away from the base substrate 20 and the second transparent electrode layer 29 located on the side of the passivation layer 25 facing away from the base substrate 20, where the second metal layer 28 includes the source-drain layer 281 in the display region 11, and the second transparent electrode layer 29 is electrically connected to the source-drain layer 281 through the second E-type via hole 265.

Exemplarily, as shown in FIG. 28, the fourth signal transmission region 125 may be understood as a region where the thin film transistor is electrically connected to the pixel electrode to transmit a display signal. As shown in FIG. 28, the second transparent electrode 29 (i.e., the pixel electrode) is electrically connected to the source-drain layer 281 through the second E-type via hole 265 to receive the display signal and ensure that the display panel can perform the normal display.

Optionally, the planarization layer 27 fills the first via holes 24; or the display panel further includes the second metal layer 28 located between the first metal layer 21 and the planarization layer 27, where the second metal layer 28 fills the first via holes 24, and an alignment mark 33 is formed on a side of the planarization layer 27 facing away from the base substrate 20.

Exemplarily, as shown in FIG. 30, the planarization layer 27 fills first via holes 24, so that a degree to which a light path is changed at the positions of the first via holes 24 can be reduced, the influence of the first via holes 24 in the first insulation layer 22 on the alignment of the subsequent films can be reduced, and the alignment accuracy of the subsequent films can be improved. Specifically, the influence of the lower films on an alignment accuracy of the upper films in the display panel can be reduced by the first insulation layer 22 and by adjusting an alignment device (e.g., a CCD), improving the preparation yield of the display panel.

Alternatively, as shown in FIGS. 33 and 34, a light-blocking metal layer 34 completely covers the first insulation layer 22 and fills the first via holes 24 in the first insulation layer 22. Since the light-blocking metal layer 34 has a good capability of reflecting light, most of light rays incident onto the light-blocking metal layer 34 are emitted to a side of the light-blocking metal layer 34 facing away from the base substrate 20, and few light rays change their paths at the positions of the first via holes 24. Therefore, the problem of the influence of the first via holes 24 on the alignment accuracy of the films above the first via holes 24 can be neglected, so that the high alignment accuracy of the films above the first via holes 24 can be ensured. Due to an opaque property of the light-blocking metal layer 34, the alignment mark 33 on the base substrate 20 is covered by the light-blocking metal layer 34. To avoid affecting normal alignment of a film above the light-blocking metal layer 34, the alignment mark 33 is formed again on the planarization layer 27 in the embodiments of the present disclosure, and the films above the planarization layer 27 may be accurately aligned by the alignment mark 33 on the planarization layer 27, ensuring the high alignment accuracy of the films of the display panel, avoiding risks of ramps and broken lines of some films at positions of via holes, and improving the preparation yield of the display panel.

Figure 36:
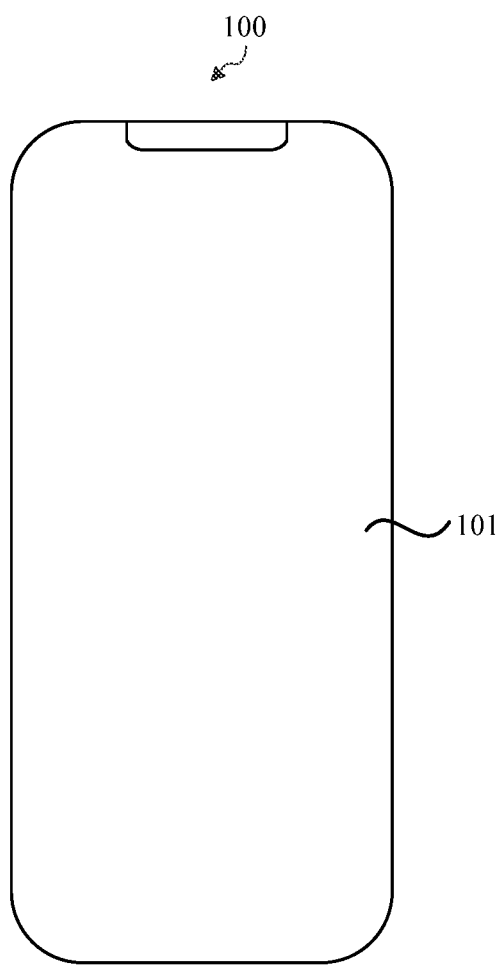
FIG. 36 is a structural view of a display device according to an embodiment of the present disclosure.

Optionally, as shown in FIGS. 14, 15, 18, 20, 22, 26, and 28, an area of the vertical projection of the first via hole 24 on the plane where the base substrate 20 is located is greater than an area of the vertical projection of the second via hole 26 on the plane where the base substrate 20 is located, ensuring gentle ramps of the other films in regions corresponding to the first via holes 24 and the second via holes 26, that broken lines of the other films do not occur in the regions corresponding to the first via holes 24 and the second via holes 26, and that the display panel can perform the normal operation and display without being affected by the first via holes 24 and the second via holes 26. Optionally, the display panel according to the embodiments of the present disclosure may include a liquid crystal display panel or an organic light-emitting diode display panel, which is not limited in the embodiments of the present disclosure. FIG. 36 is a structural view of a display device according to an embodiment of the present disclosure.

On the basis of the above-mentioned embodiments, the embodiments of the present disclosure further provide a display device. The display device includes any one of the display panels according to the above-mentioned embodiments. Therefore, the display device also has beneficial effects of the display panel according to the above-mentioned embodiments; similarities may be understood with reference to the above description and will not be described hereinafter.

FIG. 36 is a structural view of a display device according to an embodiment of the present disclosure. With reference to FIG. 36, a display device 100 includes a display panel 101 according to the above-mentioned embodiments.

Exemplarily, the display device 100 may an electronic device such as a mobile phone, a computer, a smart wearable device (such as a smartwatch), and an onboard display device, which is not limited in the embodiments of the present disclosure.

It is to be noted that the above are only preferred embodiments of the present disclosure and the technical principles used therein. It will be understood by those skilled in the art that the present disclosure is not limited to the specific embodiments described herein, and that the features of the various embodiments of the present disclosure may be coupled or combined in part or in whole with each other, and may be collaborated with each other and technically driven in various ways. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the inventive concept of the present disclosure. The scope of the present disclosure is determined by the scope of the appended claims.

What is claimed is:

1. A preparation method of a display panel, wherein the display panel comprises a display region and a non-display region surrounding the display region, and the preparation method comprises:
   providing a base substrate;
   preparing a first metal layer on a side of the base substrate, wherein the first metal layer comprises a gate layer located in the display region and a gate metal layer located in the non-display region;
   preparing a first insulation layer on a side of the first metal layer facing away from the base substrate;
   performing a patterning process on the first insulation layer by using a mask plate to form a plurality of first via holes in the first insulation layer;
   preparing a passivation layer on a side of the first insulation layer facing away from the base substrate; and
   performing a patterning process on the passivation layer by using the mask plate to form a plurality of second via holes in the passivation layer, wherein a vertical projection of each of the first via holes on a plane where the base substrate is located covers a vertical projection of one of the second via holes on the plane where the base substrate is located.

2. The preparation method of claim 1, wherein preparing a passivation layer on a side of the first insulation layer facing away from the base substrate comprises:
   preparing a planarization layer on the side of the first insulation layer facing away from the base substrate; and
   preparing the passivation layer on a side of the planarization layer facing away from the base substrate.

3. The preparation method of claim 2, wherein the non-display region comprises a signal terminal providing region;
   wherein performing a patterning process on the first insulation layer by using a mask plate to form a plurality of first via holes in the first insulation layer comprises: performing the patterning process on the first insulation layer located in the signal terminal providing region by using the mask plate to form a first A-type via hole in the first insulation layer corresponding to the signal terminal providing region;
   wherein performing a patterning process on the passivation layer by using the mask plate to form a plurality of second via holes in the passivation layer comprises: performing the patterning process on the passivation layer located in the signal terminal providing region by using the mask plate to form a second A-type via hole in the passivation layer corresponding to the signal terminal providing region; wherein a vertical projection of the first A-type via hole on the plane where the base substrate is located covers a vertical projection of the second A-type via hole on the plane where the base substrate is located;
   wherein after preparing the first insulation layer on the side of the first metal layer facing away from the base substrate, the preparation method further comprises: preparing a second metal layer on the side of the first insulation layer facing away from the base substrate, wherein the second metal layer comprises a source-drain metal layer located in the non-display region, and the source-drain metal layer is electrically connected to the gate metal layer through the first A-type via hole; and
   the preparation method further comprises: preparing a second transparent electrode layer on a side of the passivation layer facing away from the base substrate, wherein the second transparent electrode layer is electrically connected to the source-drain metal layer through the second A-type via hole.

4. The preparation method of claim 2, wherein the display region and/or the non-display region comprise a first signal transmission region;
   wherein performing a patterning process on the first insulation layer by using a mask plate to form a plurality of first via holes in the first insulation layer comprises: performing the patterning process on the first insulation layer located in the first signal transmission region by using the mask plate to form a first B-type via hole in the first insulation layer corresponding to the first signal transmission region;
   wherein performing a patterning process on the passivation layer by using the mask plate to from a plurality of second via holes in the passivation layer comprises: performing the patterning process on the passivation layer located in the first signal transmission region by using the mask plate to form a second B-type via hole in the passivation layer corresponding to the first signal transmission region; wherein a vertical projection of the first B-type via hole on the plane where the base substrate is located covers a vertical projection of the second B-type via hole on the plane where the base substrate is located; and
   after preparing the first insulation layer on the side of the first metal layer facing away from the base substrate, the preparation method further comprises: preparing a second metal layer on the side of the first insulation layer facing away from the base substrate, wherein the second metal layer comprises a source-drain layer located in the display region and a source-drain metal layer located in the non-display region; the source-drain layer is electrically connected to the gate layer through the first B-type via hole, and/or the source-drain metal layer is electrically connected to the gate metal layer through the first B-type via hole.

5. The preparation method of claim 2, wherein the non-display region comprises a second signal transmission region;
   wherein performing a patterning process on the first insulation layer by using a mask plate to form a plurality of first via holes in the first insulation layer comprises: performing the patterning process on the first insulation layer located in the second signal transmission region by using the mask plate to form a first C-type via hole in the first insulation layer corresponding to the second signal transmission region;
   wherein performing a patterning process on the passivation layer by using the mask plate to from a plurality of second via holes in the passivation layer comprises: performing the patterning process on the passivation layer located in the second signal transmission region by using the mask plate to form a second C-type via hole in the passivation layer corresponding to the second signal transmission region; wherein a vertical projection of the first C-type via hole on the plane where the base substrate is located covers a vertical projection of the second C-type via hole on the plane where the base substrate is located; and
   the preparation method further comprises: preparing a second transparent electrode layer on a side of the passivation layer facing away from the base substrate, wherein the second transparent electrode layer is electrically connected to the gate metal layer through the second C-type via hole and the first C-type via hole.

6. The preparation method of claim 2, wherein the non-display region comprises a second signal transmission region and a third signal transmission region;
- wherein performing a patterning process on the first insulation layer by using a mask plate to form a plurality of first via holes in the first insulation layer comprises: performing the patterning process on the first insulation layer located in the second signal transmission region and the first insulation layer located in the third signal transmission region by using the mask plate separately to form a first C-type via hole on the first insulation layer corresponding to the second signal transmission region and form a first D-type via hole in the first insulation layer corresponding to the third signal transmission region;
- wherein performing a patterning process on the passivation layer by using the mask plate to from a plurality of second via holes in the passivation layer comprises: performing the patterning process on the passivation layer located in the second signal transmission region and the passivation layer located in the third signal transmission region by using the mask plate separately to form a second C-type via hole in the passivation layer corresponding to the second signal transmission region and form a second D-type via hole in the passivation layer corresponding to the third signal transmission region; wherein a vertical projection of the first C-type via hole on the plane where the base substrate is located covers a vertical projection of the second C-type via hole on the plane where the base substrate is located, and a vertical projection of the first D-type via hole on the plane where the base substrate is located covers a vertical projection of the second D-type via hole on the plane where the base substrate is located; and
- the preparation method further comprises:
- preparing a first transparent electrode layer between the planarization layer and the passivation layer; and
- preparing a second transparent electrode layer on a side of the passivation layer facing away from the base substrate, wherein the second transparent electrode layer is electrically connected to the gate metal layer through the second C-type via hole and the first C-type via hole, and the second transparent electrode layer is electrically connected to the first transparent electrode layer through the second D-type via hole.

7. The preparation method of claim 2, wherein the display region comprises a fourth signal transmission region;
- wherein performing a patterning process on the first insulation layer by using a mask plate to form a plurality of first via holes in the first insulation layer comprises: performing the patterning process on the first insulation layer located in the fourth signal transmission region by using the mask plate to form a first E-type via hole in the first insulation layer corresponding to the fourth signal transmission region;
- wherein performing a patterning process on the passivation layer by using the mask plate to from a plurality of second via holes in the passivation layer comprises: performing the patterning process on the passivation layer located in the fourth signal transmission region by using the mask plate to form a second E-type via hole in the passivation layer corresponding to the fourth signal transmission region; wherein a vertical projection of the first E-type via hole on the plane where the base substrate is located covers a vertical projection of the second E-type via hole on the plane where the base substrate is located;
- wherein after preparing the first insulation layer on the side of the first metal layer facing away from the base substrate, the preparation method further comprises: preparing a second metal layer on the side of the first insulation layer facing away from the base substrate, wherein the second metal layer comprises a source-drain layer located in the display region; and
- the preparation method further comprises: preparing a second transparent electrode layer on a side of the passivation layer facing away from the base substrate, wherein the second transparent electrode layer is electrically connected to the source-drain layer through the second E-type via hole.

8. The preparation method of claim 2, wherein preparing a planarization layer on the side of the first insulation layer facing away from the base substrate comprises:
- preparing the planarization layer on the side of the first insulation layer facing away from the base substrate, wherein the planarization layer fills the first via holes.

9. The preparation method of claim 2, wherein before preparing a planarization layer on the side of the first insulation layer facing away from the base substrate, the preparation method comprises:
- preparing a light-blocking metal layer on the side of the first insulation layer facing away from the base substrate, wherein the light-blocking metal layer fills the first via holes; and
- wherein preparing a planarization layer on the side of the first insulation layer facing away from the base substrate comprises:
- preparing the planarization layer on a side of the light-blocking metal layer facing away from the base substrate; and
- preparing an alignment mark on the side of the planarization layer facing away from the base substrate.

10. The preparation method of claim 1, wherein performing a patterning process on the first insulation layer by using a mask plate to form a plurality of first via holes in the first insulation layer comprises:
- coating a positive photoresist on the side of the first insulation layer facing away from the base substrate;
- performing exposure treatment on the positive photoresist by using the mask plate, and controlling an exposure amount of the positive photoresist to be a first exposure amount to obtain a first photoetching pattern; and
- etching the first insulation layer through the first photoetching pattern to form the plurality of first via holes in the first insulation layer; and
- wherein performing a patterning process on the passivation layer by using the mask plate to form a plurality of second via holes in the passivation layer comprises:
- coating the positive photoresist on a side of the passivation layer facing away from the base substrate;
- performing the exposure treatment on the positive photoresist by using the mask plate, and controlling the exposure amount of the positive photoresist to be a second exposure amount to obtain a second photoetching pattern; and
- etching the passivation layer through the second photoetching pattern to form the plurality of second via holes in the passivation layer;
- wherein the first exposure amount is greater than the second exposure amount.

11. A display panel prepared by the preparation method of claim 1, wherein the display panel comprises a display region and a non-display region, and further comprises:
a base substrate;
a first metal layer located on a side of the base substrate, wherein the first metal layer comprises a gate layer located in the display region and a gate metal layer located in the non-display region;
a first insulation layer located on a side of the first metal layer facing away from the base substrate, wherein a plurality of first via holes are formed in the first insulation layer; and
a passivation layer located on a side of the first insulation layer facing away from the base substrate, wherein a plurality of second via holes are formed in the passivation layer, and a vertical projection of each of the first via holes on a plane where the base substrate is located covers a vertical projection of one of the second via holes on the plane where the base substrate is located.

12. The display panel of claim 11, wherein the display panel further comprises a planarization layer located between the first insulation layer and the passivation layer.

13. The display panel of claim 12, wherein the non-display region comprises a signal terminal providing region; the first via holes comprise a first A-type via hole located in the signal terminal providing region; the second via holes comprise a second A-type via hole located in the signal terminal providing region; wherein a vertical projection of the first A-type via hole on the plane where the base substrate is located covers a vertical projection of the second A-type via hole on the plane where the base substrate is located;
wherein the display panel further comprises a second metal layer located on the side of the first insulation layer facing away from the base substrate and a second transparent electrode layer located on a side of the passivation layer facing away from base substrate, wherein the second metal layer comprises a source-drain metal layer located in the non-display region;
wherein the source-drain metal layer is electrically connected to the gate metal layer through the first A-type via hole; the second transparent electrode layer is electrically connected to the source-drain metal layer through the second A-type via hole.

14. The display panel of claim 12, wherein the display region and/or the non-display region comprise a first signal transmission region; the first via holes comprise a first B-type via hole located in the first signal transmission region; the second via holes comprise a second B-type via hole located in the first signal transmission region; wherein a vertical projection of the first B-type via hole on the plane where the base substrate is located covers a vertical projection of the second B-type via hole on the plane where the base substrate is located; and
the display panel further comprises a second metal layer located on the side of the first insulation layer facing away from the base substrate, wherein the second metal layer comprises a source-drain layer located in the display region and a source-drain metal layer located in the non-display region; wherein the source-drain layer is electrically connected to the gate layer through the first B-type via hole, and/or the source-drain metal layer is electrically connected to the gate metal layer through the first B-type via hole.

15. The display panel of claim 12, wherein the non-display region comprises a second signal transmission region; the first via holes comprise a first C-type via hole located in the second signal transmission region; the second via holes comprise a second C-type via hole located in the second signal transmission region; wherein a vertical projection of the first C-type via hole on the plane where the base substrate is located covers a vertical projection of the second C-type via hole on the plane where the base substrate is located; and
the display panel further comprises a second transparent electrode layer located on a side of the passivation layer facing away from the base substrate; wherein the second transparent electrode layer is electrically connected to the gate metal layer through the second C-type via hole and the first C-type via hole.

16. The display panel of claim 12, wherein the non-display region comprises a second signal transmission region and a third signal transmission region; the first via holes comprise a first C-type via hole located in the second signal transmission region and a first D-type via hole located in the third signal transmission region; the second via holes comprise a second C-type via hole located in the second signal transmission region and a second D-type via hole located in the third signal transmission region; wherein a vertical projection of the first C-type via hole on the plane where the base substrate is located covers a vertical projection of the second C-type via hole on the plane where the base substrate is located, and a vertical projection of the first D-type via hole on the plane where the base substrate is located covers a vertical projection of the second D-type via hole on the plane where the base substrate is located; and
the display panel further comprises a first transparent electrode layer located between the planarization layer and the passivation layer and a second transparent electrode layer located on a side of the passivation layer facing away from the base substrate, wherein the second transparent electrode layer is electrically connected to the gate metal layer through the second C-type via hole and the first C-type via hole, and the second transparent electrode layer is electrically connected to the first transparent electrode layer through the second D-type via hole.

17. The display panel of claim 12, wherein the display region comprises a fourth signal transmission region; the first via holes comprise a first E-type via hole located in the fourth signal transmission region; the second via holes comprise a second E-type via hole located in the fourth signal transmission region; wherein a vertical projection of the first E-type via hole on the plane where the base substrate is located covers a vertical projection of the second E-type via hole on the plane where the base substrate is located; and
the display panel further comprises a second metal layer located on the side of the first metal layer facing away from the base substrate and a second transparent electrode layer located on a side of the passivation layer facing away from the base substrate, wherein the second metal layer comprises a source-drain layer located in the display region, and the second transparent electrode layer is electrically connected to the source-drain layer through the second E-type hole.

18. The display panel of claim 12, wherein the planarization layer fills the first via holes; or
the display panel further comprises a second metal layer located between the first metal layer and the planarization layer, wherein the second metal layer fills the first via holes, and an alignment mark is formed on the side of the planarization layer facing away from the base substrate.

19. The display panel of claim 11, wherein an area of the vertical projection of each of the first via holes on the plane where the base substrate is located is greater than an area of the vertical projection of one of the second via holes on the plane where the base substrate is located.

20. A display device, comprising the display panel of claim 11.

* * * * *